(12) United States Patent
Nagata et al.

(10) Patent No.: US 11,784,197 B2
(45) Date of Patent: Oct. 10, 2023

(54) SOLID-STATE IMAGING UNIT, METHOD OF PRODUCING THE SAME, AND ELECTRONIC APPARATUS

(71) Applicant: SONY SEMICONDUCTOR SOLUTIONS CORPORATION, Kanagawa (JP)

(72) Inventors: Masaya Nagata, Kanagawa (JP); Satoru Wakiyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/726,114

(22) Filed: Apr. 21, 2022

(65) Prior Publication Data

US 2022/0246655 A1    Aug. 4, 2022

Related U.S. Application Data

(63) Continuation of application No. 16/639,229, filed as application No. PCT/JP2018/029730 on Aug. 8, 2018, now Pat. No. 11,335,715.

(30) Foreign Application Priority Data

Aug. 22, 2017   (JP) ................................ 2017-159090

(51) Int. Cl.
*H01L 27/146*   (2006.01)
*H04N 25/70*    (2023.01)

(52) U.S. Cl.
CPC ....... *H01L 27/14612* (2013.01); *H04N 25/70* (2023.01); *H01L 27/14629* (2013.01); *H01L 27/14636* (2013.01)

(58) Field of Classification Search
CPC ......... H01L 27/14612; H01L 27/14629; H01L 27/14636; H01L 2224/11; H01L 2224/81;
(Continued)

(56) References Cited

U.S. PATENT DOCUMENTS

2006/0171698 A1   8/2006  Ryu et al.
2006/0180745 A1   8/2006  Lee
(Continued)

FOREIGN PATENT DOCUMENTS

EP        2876682         5/2015
JP      2000-323616      11/2000
(Continued)

OTHER PUBLICATIONS

International Search Report and Written Opinion for International (PCT) Patent Application No. PCT/JP2018/029730, dated Nov. 6, 2018, 7 pages.
(Continued)

*Primary Examiner* — John P. Dulka
(74) *Attorney, Agent, or Firm* — Sheridan Ross PC

(57) ABSTRACT

The present technology relates to a solid-state imaging unit that makes it possible to increase the number of terminals, a method of producing the same, and an electronic apparatus. A solid-state imaging unit includes: an image sensor substrate including a light receiving region in which pixels that each convert incoming light to an electric signal are arranged in a matrix; a solder ball; a glass substrate opposite the image sensor substrate and the solder ball; and a through electrode that couples a wiring line pattern and the solder ball to each other by penetrating a glass adhesive resin interposed between the wiring line pattern and the solder ball. The solder ball is disposed outside the image sensor substrate in a plane direction. The wiring line pattern being formed on the glass substrate. The present disclosure is applicable, for example, to a package and the like including the image sensor substrate.

20 Claims, 27 Drawing Sheets

(58) Field of Classification Search
CPC . H01L 2224/81192; H01L 2924/15173; H01L 27/14618; H01L 21/56; H01L 23/12; H04N 25/70; H04N 25/00; H04N 1/028
See application file for complete search history.

(56) References Cited

U.S. PATENT DOCUMENTS

| | | | |
|---|---|---|---|
| 2008/0083980 A1* | 4/2008 | Yang | H01L 27/14683 257/E27.15 |
| 2009/0256260 A1* | 10/2009 | Nakamura | H01L 27/14683 257/431 |
| 2011/0180891 A1* | 7/2011 | Lin | H01L 27/14625 257/E31.127 |
| 2013/0181313 A1* | 7/2013 | Nagata | H01L 27/14618 257/433 |
| 2015/0255500 A1* | 9/2015 | Akahoshi | H01L 24/19 257/434 |
| 2017/0117320 A1* | 4/2017 | Matsugai | H01L 27/14645 |
| 2018/0019277 A1 | 1/2018 | Nagata et al. | |
| 2018/0204875 A1 | 7/2018 | Matsugai | |
| 2020/0203408 A1 | 6/2020 | Nagata et al. | |

FOREIGN PATENT DOCUMENTS

| | | |
|---|---|---|
| JP | 2006-216935 | 8/2006 |
| JP | 2012-114370 | 6/2012 |
| JP | 2013080838 A | 5/2013 |
| JP | 2013-143520 | 7/2013 |
| JP | 2016-001681 | 1/2016 |
| JP | 2016-015406 | 1/2016 |
| WO | WO 2014/083750 | 6/2014 |
| WO | WO 2017/135062 | 8/2017 |

OTHER PUBLICATIONS

Extended European Search Report for European Patent Application No. 18848058.6, dated Jul. 10, 2020, 7 pages.
Official Action for U.S. Appl. No. 16/639,229, dated Oct. 14, 2021, 13 pages.
Notice of Allowance for U.S. Appl. No. 16/639,229, dated Jan. 13, 2022, 8 pages.

* cited by examiner

SOLID-STATE IMAGING UNIT, METHOD OF PRODUCING THE SAME, AND ELECTRONIC APPARATUS

CROSS REFERENCE TO RELATED APPLICATIONS

This application is a continuation application of U.S. patent application Ser. No. 16/639,229, filed Feb. 14, 2020, which is a national stage application under 35 U.S.C. 371 and claims the benefit of PCT Application No. PCT/JP2018/029730, having an international filing date of 8 Aug. 2018, which designated the United States, which PCT application claimed the benefit of Japanese Patent Application No. 2017-159090 filed 22 Aug. 2017, the entire disclosures of each of which are incorporated herein by reference.

TECHNICAL FIELD

The present technology relates to a solid-state imaging unit, a method of producing the same, and an electronic apparatus. Particularly, the present technology relates to a solid-state imaging unit that makes it possible to increase the number of terminals, a method of producing the same, and an electronic apparatus.

BACKGROUND ART

As semiconductor packages (PKG) for image sensors, ceramic PKG, organic BGAPKG in which BGA is placed on an organic substrate, Fan-in Chip Size Wafer Level PKG, and the like are generally known (see PTL 1, for example). Fan-in means a structure in which terminals are disposed on a lower surface of an image sensor chip.

By contrast, in the field of Memory/Logic, there has recently been a strong demand for chips having higher performance and smaller size, and fan-out semiconductor packages that allow for dense packing have been gaining widespread use (see PTL 2, for example). Fan-out means a structure in which terminals are disposed outside a chip.

CITATION LIST

Patent Literature

PTL 1: Japanese Unexamined Patent Application Publication No. 2012-114370
PTL 2: Japanese Unexamined Patent Application Publication No. 2000-323616

SUMMARY OF THE INVENTION

Problems to be Solved by the Invention

Higher performance and higher speed of semiconductor packages for image sensors have given rise to a demand for high-speed InterFaces, and a further increase in the number of terminals is expected.

The present technology has been devised in view of such circumstances to make it possible to increase the number of terminals.

Means for Solving the Problems

A solid-state imaging unit according to a first aspect of the present technology includes: an image sensor substrate including a light receiving region in which pixels that each convert incoming light to an electric signal are arranged in a matrix; an external terminal that outputs the electric signal; a glass substrate disposed to be opposed to the image sensor substrate and the external terminal; and a through electrode that couples a wiring line and the external terminal to each other by penetrating an adhesive resin interposed between the wiring line and the external terminal. The external terminal is disposed outside the image sensor substrate in a plane direction. The wiring line is formed on the glass substrate.

A method of producing a solid-state imaging unit according to a second aspect of the present technology includes: forming a wiring line on a glass substrate; forming an adhesive resin on the glass substrate on which the wiring line is formed; bonding a singulated image sensor substrate to the glass substrate to couple the singulated image sensor substrate to the wiring line; forming a through electrode outside the image sensor substrate in a plane direction; and forming an external terminal to couple the external terminal to the through electrode. The through electrode is coupled to the wiring line by penetrating the adhesive resin.

An electronic apparatus according to a third aspect of the present technology includes a solid-state imaging unit. The solid-state imaging unit includes an image sensor substrate including a light receiving region in which pixels that each convert incoming light to an electric signal are arranged in a matrix; an external terminal that outputs the electric signal; a glass substrate disposed to be opposed to the image sensor substrate and the external terminal; and a through electrode that couples a wiring line and the external terminal to each other by penetrating an adhesive resin interposed between the wiring line and the external terminal. The external terminal is disposed outside the image sensor substrate in a plane direction. The wiring line is formed on the glass substrate.

The solid-state imaging unit according to the first to third aspects of the present technology is provided with: an image sensor substrate including a light receiving region in which pixels that each convert incoming light to an electric signal are arranged in a matrix; an external terminal that outputs the electric signal; a glass substrate disposed to be opposed to the image sensor substrate and the external terminal; and a through electrode that couples a wiring line and the external terminal to each other by penetrating an adhesive resin interposed between the wiring line and the external terminal. The external terminal is disposed outside the image sensor substrate in a plane direction. The wiring line is formed on the glass substrate.

According to the second aspect of the present technology, a wiring line is formed on a glass substrate. An adhesive resin is formed on the glass substrate on which the wiring line is formed. A singulated image sensor substrate is bonded to the glass substrate to couple the singulated image sensor substrate to the wiring line. A through electrode is formed outside the image sensor substrate in a plane direction. An external terminal is formed to couple the external terminal to the through electrode. The through electrode is coupled to the wiring line by penetrating the adhesive resin.

The solid-state imaging unit and the electronic apparatus may be independent devices or modules to be incorporated into another device.

Effects of the Invention

According to the first to third aspects of the present technology, it is possible to increase the number of terminals while miniaturizing a package.

MODES FOR CARRYING OUT THE INVENTION

The following describes an example for implementing the present technology (which will be referred to as embodiment below). It should be noted that description is given in the following order.

1. First Embodiment of Solid-state Imaging Unit (Configuration Example of Fan-out Image Sensor PKG)
2. Second Embodiment of Solid-state Imaging Unit (Configuration Example in which Metal Film Is Added to Lower Surface of Image Sensor Substrate)
3. Third Embodiment of Solid-state Imaging Unit (Configuration Example in which Heat-dissipating Plate Is Added)
4. Configuration Example of Solid-state Imaging Unit Applicable as Image Sensor Substrate 11
5. Example of Application to Electronic Apparatus
6. Usage Examples of Image Sensor
7. Example of Application to In-vivo Information Acquisition System
8. Example of Application to Endoscopic Surgery System
9. Example of Application to Mobile Body

1. First Embodiment of Solid-State Imaging Unit

<Cross-sectional View of Image Sensor PKG>

Figure 1:
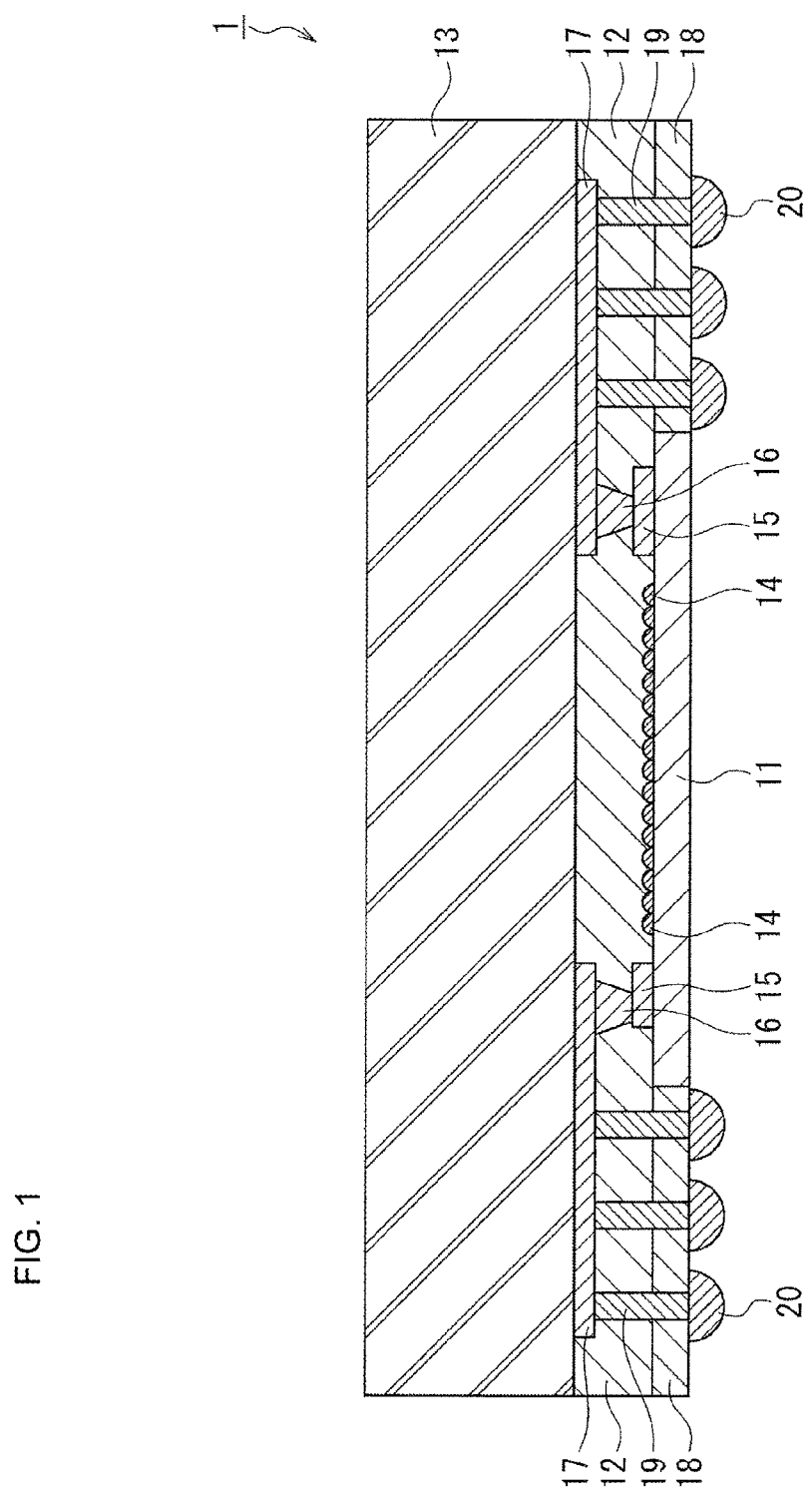
FIG. 1 is a cross-sectional view of a first embodiment of an image sensor PKG serving as a solid-state imaging unit to which the present disclosure is applied.

FIG. 1 is a cross-sectional view of a first embodiment of an image sensor PKG (package) serving as a solid-state imaging unit to which the present disclosure is applied.

An image sensor PKG 1 illustrated in FIG. 1 includes an image sensor substrate 11 that converts light coming from above in the diagram to an electric signal. The following refers to a top surface serving as a light incidence surface of the image sensor substrate 11 in the diagram as an upper surface, and a surface opposite to the light incidence surface as a lower surface.

A glass substrate 13 is disposed on an upper side serving as a light incidence side of the singulated image sensor substrate 11, and a glass adhesive resin 12 couples the image sensor substrate 11 and the glass substrate 13 to each other with no gap therebetween.

The glass substrate 13 has a larger plan size than that of the image sensor substrate 11. The image sensor substrate 11 is disposed substantially at the center of the glass substrate 13 in a plan view. A molding resin 18 seals the glass adhesive resin 12 in an area located on the same plane as the plane of the image sensor substrate 11 and outside the image sensor substrate 11.

In other words, therefore, the image sensor substrate 11 disposed substantially at the center of the image sensor PKG 1 and the molding resin 18 formed on an outer periphery thereof on the same plane are disposed to be opposed to the glass substrate 13 with the glass adhesive resin 12 therebetween.

As a material of the glass adhesive resin 12, a resin having a similar refractive index to that of the glass substrate 13, for example, a refractive index of approximately 1.4 to 1.6 is used. Needless to say, the glass adhesive resin 12 is transmissive to light to allow incoming light to enter pixels of the image sensor substrate 11.

The image sensor substrate 11 includes a light receiving region in which pixels that convert incoming light to an electric signal are arranged in a matrix, and an on-chip lens 14 is formed on an uppermost layer of each of the pixels. Each of the pixels includes, for example, a photodiode (PD) for photoelectric conversion, a plurality of pixel transistors that controls an photoelectric conversion operation and an operation of reading out an electric signal obtained through photoelectric conversion, and a color filter of a color such as R (red), G (green), or B (blue). Desirably, the pixel transistors are MOS transistors, for example.

On the upper surface (surface opposed to the glass substrate 13) of the image sensor substrate 11, a plurality of electrode pads 15 for inputting and outputting signals, power, and the like to and from the image sensor substrate 11 is formed on an outer periphery side of the on-chip lenses 14 formed in the light receiving region. Each of the electrode pads 15 is coupled to a wiring line pattern 17 with a pillar 16 therebetween. The wiring line pattern 17 is formed on a lower surface of the glass substrate 13.

The wiring line pattern 17 is formed to extend toward an outer periphery of the image sensor PKG 1 and is coupled to a plurality of through electrodes 19 penetrating the glass adhesive resin 12 and the molding resin 18 around the outer periphery of the image sensor substrate 11. Each of the through electrodes 19 is coupled to at least one of a plurality of solder balls 20 formed on an outside of the molding resin 18.

The solder balls 20 are external terminals electrically coupled to a wiring line outside the unit. The wiring line is not illustrated. The external terminals input and output, to and from the outside of the unit, signals, power, and the like of the image sensor substrate 11 that are transmitted through the electrode pads 15, the pillars 16, the wiring line pattern 17, and the through electrodes 19 of the image sensor substrate 11.

One of structural characteristics of the image sensor PKG 1 having the above-described configuration is that the image sensor PKG 1 has a so-called Fan-out package structure in which the solder balls 20 are provided as external terminals outside (around the outer periphery of) the image sensor substrate 11 in a plane direction to input and output input/output signals, power, and the like of the image sensor substrate 11 through the solder balls 20. This structure enables the image sensor PKG 1 to have an increased number of terminals.

In addition, another one of the structural characteristics of the image sensor PKG 1 is that the image sensor PKG 1 is cavity-less because the light transmissive glass adhesive resin 12 fills the gaps between the glass substrate 13, and the image sensor substrate 11 opposed thereto and the molding resin 18 opposed thereto. It is also a characteristic that the same glass adhesive resin 12 fills both the gap between the glass substrate 13 and the image sensor substrate 11 and the gap between the glass substrate 13 and the molding resin 18. The pillars 16 that transmit signals and the like between the wiring line pattern 17 of the glass substrate 13 and the electrode pads 15 of the image sensor substrate 11 are formed to penetrate the glass adhesive resin 12. The through electrodes 19 that transmit signals and the like between the wiring line pattern 17 of the glass substrate 13 and the solder balls 20 are formed to penetrate the glass adhesive resin 12 and the molding resin 18. This cavity-less structure allows the image sensor substrate 11 to have a thickness reduced to a minimum necessary thickness, and thus allows the image sensor PKG 1 to have a reduced height and a reduced size, which will be described in detail in association with below-described production steps.

It should be noted that, due to space limitations, FIG. 1 illustrates that the plurality of through electrodes 19 and the plurality of solder balls 20 are coupled to one wiring line path of the electrode pads 15, the pillars 16, and the wiring line pattern 17, but naturally, each signal line, each control line, a power line, and a GND line are separated, insulated, and placed appropriately.

Figure 2:
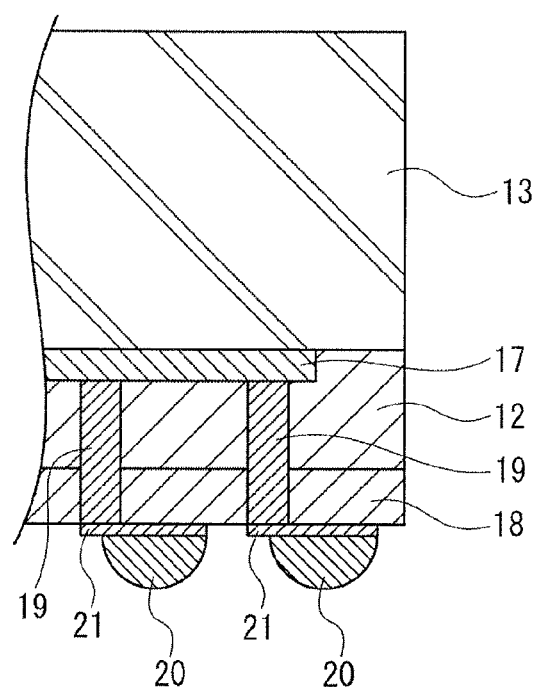
FIG. 2 is a cross-sectional view of the image sensor PKG in FIG. 1 in a case where a rewiring line is formed in the image sensor PKG.

Furthermore, FIG. 1 illustrates only the configuration in which the solder balls 20 are disposed right under the through electrodes 19, but the image sensor PKG 1 may have a configuration in which, for example, rewiring lines 21 are formed on a lower surface of the molding resin 18 and the through electrodes 19 and the solder balls 20 are electrically coupled to each other through the rewiring lines 21 as illustrated in FIG. 2.

<Production Method of First Embodiment>

Next, a method of producing the image sensor PKG 1 according to the first embodiment is described with reference to FIGS. 3 and 4.

Figure 3:
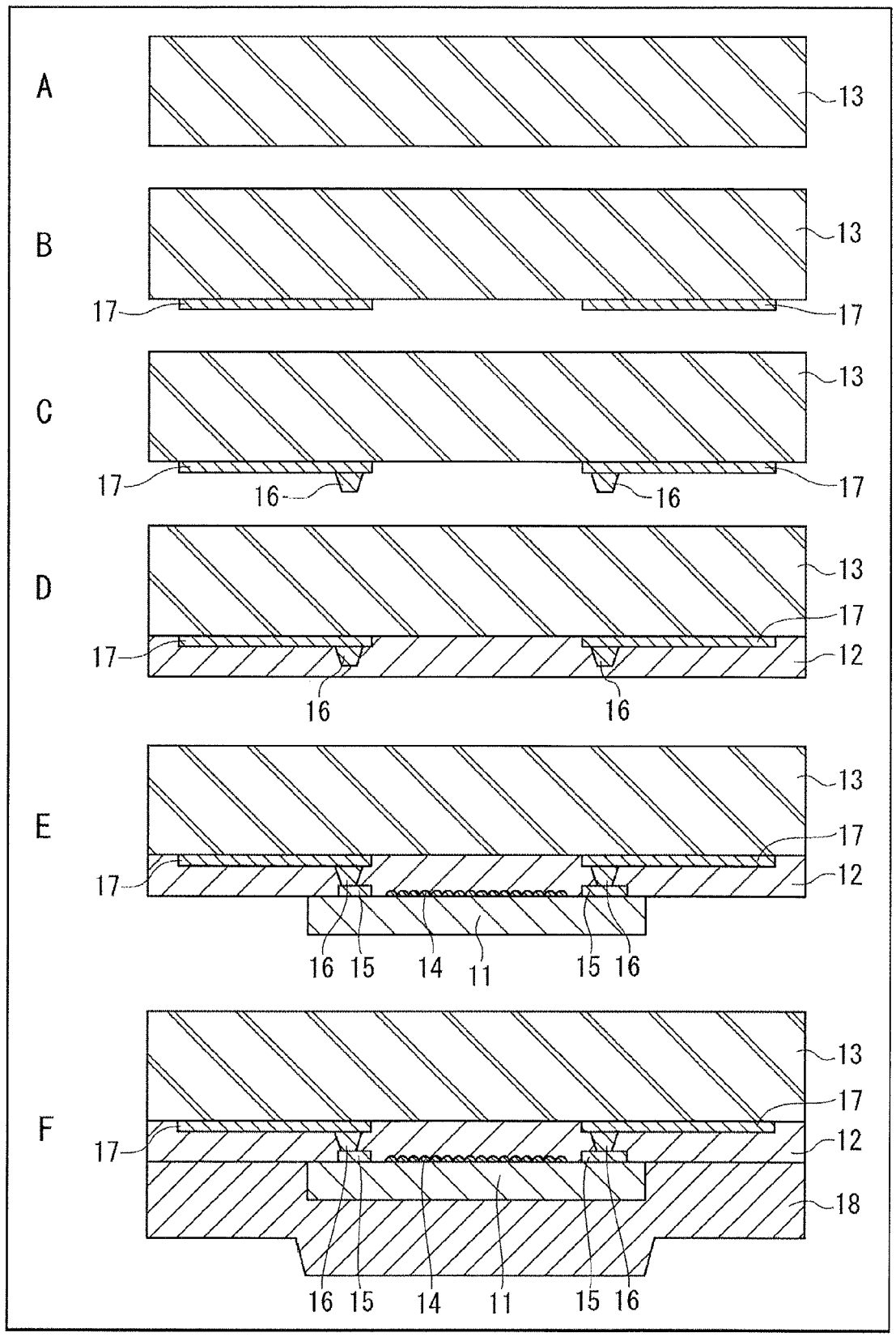
FIG. 3 is a diagram describing a method of producing the image sensor PKG according to the first embodiment.

First, as illustrated in A and B of FIG. 3, the predetermined wiring line pattern 17 is formed on one (lower surface in the diagram) of the surfaces of the glass substrate 13 prepared. It is possible to include a single layer or multiple layers of a metal material(s) such as Al, AlCu, AlSiCu, Cu, Ti, Cr, and Ni in the wiring line pattern 17. In addition, it is also possible to adopt any method such as sputtering, electrolytic plating, electroless plating, and vapor deposition as the formation method. For example, the wiring line pattern 17 is formed by forming Ti or Cu as a seed layer by sputtering, and then forming Cu, Cr, or Ni by electrolytic plating. Regions other than a pattern region of the wiring line pattern 17 and the seed layer are removed in a case where electroless plating is used in a subsequent pillar formation step. By contrast, the seed layer is left unremoved in a case where electrolytic plating is used. Furthermore, in a case where Al, AlCu, AlSiCu, or the like is used as a metal material, for example, the wiring line pattern 17 is formed by using sputtering, vapor deposition, or the like.

Next, as illustrated in C of FIG. 3, the pillars 16 are formed using a metal material such as Au, Cu, and Ni on predetermined portions of the formed wiring line pattern 17 by electrolytic plating or electroless plating. Portions of the wiring line pattern 17 other than the portions on which the pillars 16 are formed are covered with a resist (not illustrated). The resist is removed after the pillars 16 are formed. However, in a case where electrolytic plating is used, the seed layer left unremoved in the step of forming the wiring line pattern 17 in B of FIG. 3 is also removed.

Next, as illustrated in D of FIG. 3, the glass adhesive resin 12 is formed on the glass substrate 13 having the pillars 16 and the wiring line pattern 17 formed thereon to the extent that the pillars 16 are covered. A semi-cured resin material is adopted for the glass adhesive resin 12. The refractive index thereof is set to approximately 1.4 to 1.6, which is similar to the refractive index of the glass substrate 13. Furthermore, the refractive index of the glass adhesive resin 12 is designed to be lower than that of the on-chip lenses 14.

Next, as illustrated in E of FIG. 3, the image sensor substrate 11 singulated after photodiodes, a plurality of pixel transistors, signal processing circuits, and the like are formed thereon is bonded to the glass substrate 13 having the pillars 16 and the wiring line pattern 17 formed thereon. In this bonding step, pressurization is performed after the electrode pads 15 formed on the image sensor substrate 11 are horizontally aligned to be coupled to the pillars 16. Through the pressurization, the glass adhesive resin 12 on a tip portion of each of the pillars 16 is pushed to the periphery and the glass adhesive resin 12 is cured after the electrode pads 15 and the pillars 16 are physically coupled to each other.

Next, as illustrated in F of FIG. 3, the molding resin 18 is applied to the mounted image sensor substrate 11 and an upper surface (lower surface in FIG. 3) of the glass adhesive resin 12 therearound, and then cured. Preferably, a resin material of the molding resin 18 has a low thermal expansion coefficient. It should be noted that the molding resin 18 and the glass adhesive resin 12 may be cured concurrently.

Figure 4:
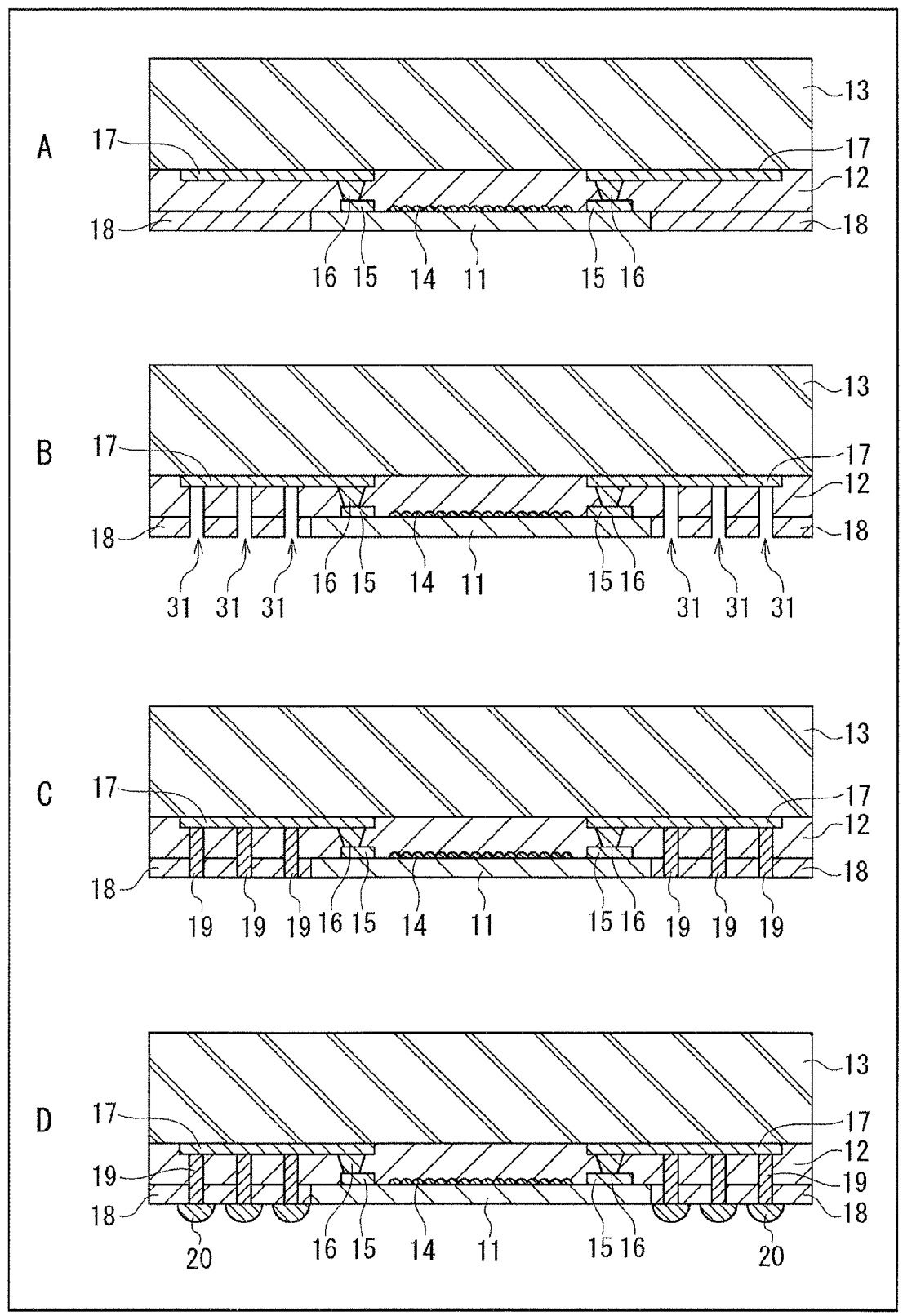
FIG. 4 is a diagram describing the method of producing the image sensor PKG according to the first embodiment.

Next, as illustrated in A of FIG. 4, the molding resin 18 and the image sensor substrate 11 are grinded and thinned with a backgrinder until the image sensor substrate 11 has a predetermined thickness. As a result, a whole surface on which the image sensor substrate 11 is disposed becomes flat, and the molding resin 18 and the image sensor substrate 11 have the same thickness.

In this grinding step, specific force in a direction toward the glass substrate 13 is applied to the image sensor substrate 11. However, the cavity-less structure in which the gap between the glass substrate 13 and the image sensor substrate 11 is completely filled with the glass adhesive resin 12 increases the strength against the force applied in the direction toward the glass substrate 13, allowing the image sensor substrate 11 to be thinned to the utmost. In a case where the gap between the glass substrate 13 and the image sensor substrate 11 is not filled with the glass adhesive resin 12 to be left empty, for example, the image sensor substrate 11 having a thickness of approximately 80 μm may be broken. By contrast, the cavity-less structure allows the image sensor substrate 11 to be thinned to a thickness of approximately several μm.

Next, as illustrated in B of FIG. 4, through holes 31 that penetrate the molding resin 18 and the glass adhesive resin 12 are formed in a predetermined region of the molding resin 18 that is located outside the image sensor substrate 11 in the plane direction. Specifically, the predetermined region is a portion in which the through electrodes 19 are to be formed. The through holes 31 are able to be formed, for example, by dry etching, laser drilling, or the like. The plurality of through holes 31 formed in a flat region where the molding resin 18 is formed reaches the wiring line pattern 17 formed on the surface of the glass substrate 13.

Next, as illustrated in C of FIG. 4, each of the plurality of through holes 31 formed in the flat region of the molding resin 18 is filled with a metal material to serve as an electrode, and thus the through electrodes 19 are formed. For example, the through electrodes 19 are able to be formed by forming multiple layers of Ti and Cu as seed layers by sputtering or the like, and then forming Cu or Ni by electrolytic plating.

In a case where the rewiring lines 21 are formed on the surface of the molding resin 18 as illustrated in FIG. 2, the through electrodes 19 and the rewiring lines 21 are able to be formed concurrently by forming a solder mask over a region of the surface of the molding resin 18 where the rewiring lines 21 are not to be formed, and then forming a metal material such as Cu by electrolytic plating described above. The seed layers formed in unnecessary portions are removed after the through electrodes 19 and the rewiring lines 21 are formed. In a case where Al is embedded as a metal material to serve as the through electrodes 19, sputtering is used. The seed layers may be multiple layers of Ti and Ni, or the like.

Finally, as illustrated in D of FIG. 4, the solder balls 20 serving as external terminals are formed right under the through electrodes 19 or on the rewiring lines 21 coupled to the through electrodes 19 by a method such as a solder ball mounting method to electrically couple the solder balls 20 to the through electrodes 19. Regions other than regions where the solder balls 20 are to be formed are protected with a solder mask, and the solder balls 20 are formed only in regions corresponding to openings of the solder mask. It should be noted that the solder balls 20 may be formed by screen printing.

Through the above, the image sensor PKG 1 illustrated in FIG. 1 is completed.

Since the glass adhesive resin 12 is formed at once both in a region to be sandwiched by the image sensor substrate 11 and in a region to be sandwiched by the molding resin 18 as illustrated in D of FIG. 3, the resin formed in the region in which the through electrodes 19 are formed and the resin formed on the light receiving region of the image sensor substrate 11 are the same.

Modification Examples of First Embodiment

Next, modification examples of the first embodiment illustrated in FIG. 1 are described.

Figure 5:
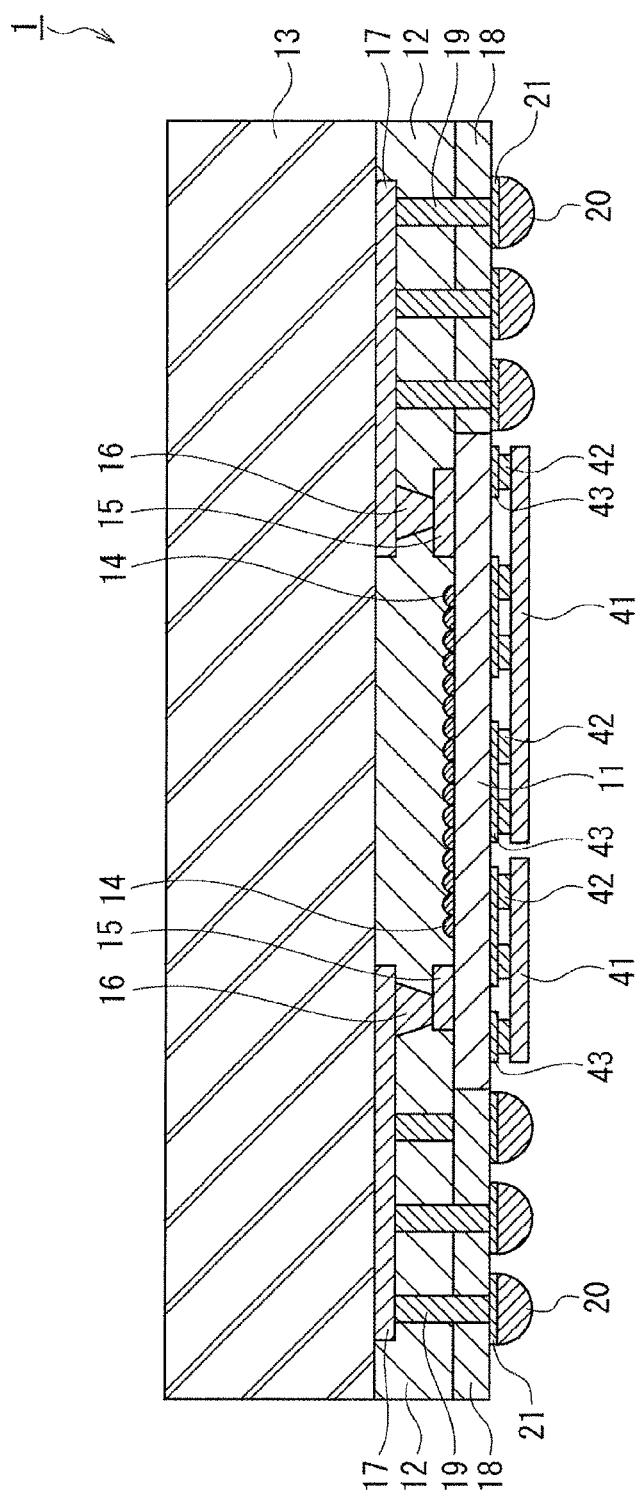
FIG. 5 is a cross-sectional view illustrating a first modification example of the first embodiment.

FIG. 5 is a cross-sectional view illustrating a first modification example of the first embodiment.

Components in FIG. 5 corresponding to those of the first embodiment illustrated in FIG. 1 are given the same reference signs, and description thereof is omitted. The following describes the other components. The same applies to a second modification example of the first embodiment illustrated in FIG. 6.

In the first embodiment illustrated in FIG. 1, nothing is formed on the lower surface (surface opposite to the glass substrate 13 side) of the image sensor substrate 11, but at least one or more companion chip 41 such as memory and logic IC are disposed on the lower surface of the image sensor substrate 11 in the first modification example illustrated in FIG. 5.

The companion chip 41 is electrically coupled to the image sensor substrate 11 through micro bumps 42 and wiring lines 43.

The wiring lines 43 formed on the lower surface of the image sensor substrate 11 are able to be formed concurrently with the rewiring lines 21 in the step of forming the rewiring lines 21 on the surface of the molding resin 18. The micro bumps 42 are able to be formed concurrently with the step of forming the solder balls 20. The companion chip 41 is mounted after the micro bumps 42 are formed.

In this manner, as the image sensor PKG 1, a configuration is also possible in which the companion chip 41 is added to the lower surface opposite to the light incidence surface of the image sensor substrate 11.

Figure 6:
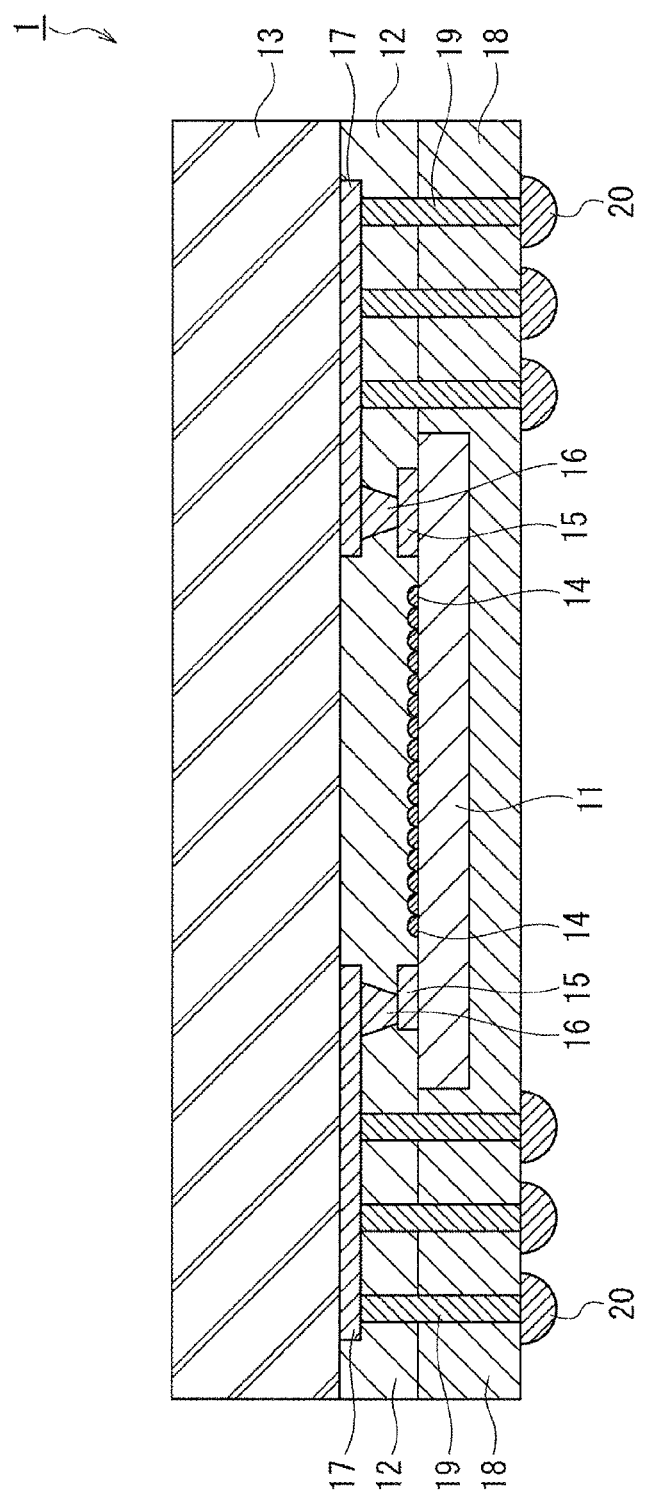
FIG. 6 is a cross-sectional view illustrating a second modification example of the first embodiment.

FIG. 6 is a cross-sectional view illustrating a second modification example of the first embodiment.

In the first embodiment illustrated in FIG. 1, the image sensor substrate 11 and the molding resin 18 have the same thickness, and the molding resin 18 is not formed on the surface opposite to the light incidence surface of the image sensor substrate 11.

By contrast, in the second modification example illustrated in FIG. 6, the molding resin 18 is formed on the lower surface opposite to the light incidence surface of the image sensor substrate 11. Furthermore, the thickness of the image sensor substrate 11 is greater than that of the first embodiment in FIG. 1.

In a case of the production of the image sensor PKG 1 according to the first embodiment illustrated in FIG. 1, as described with reference to A of FIG. 4, the molding resin 18 and the image sensor substrate 11 are grinded and thinned with a backgrinder until the image sensor substrate 11 has a predetermined thickness.

By contrast, in a case of the production of the image sensor PKG 1 according to the second modification example in FIG. 6, only the molding resin 18 in a state illustrated in F of FIG. 3 is grinded with a backgrinder, and the grinding is finished before reaching the image sensor substrate 11. This gives a structure in which the image sensor substrate 11 is covered with the molding resin 18.

In this manner, as the image sensor PKG 1, a configuration is also possible in which the lower surface opposite to the light incidence surface of the image sensor substrate 11 is not exposed, but covered with the molding resin 18. This case offers excellent waterproofness and makes it possible to further prevent the image sensor substrate 11 from being damaged because the image sensor substrate 11 is not exposed.

2. Second Embodiment of Solid-State Imaging Unit

<Cross-sectional View of Image Sensor PKG>

Next, a second embodiment of the image sensor PKG is described.

The second embodiment and a third embodiment of the image sensor PKG described below are achieved by improving thermal dissipation properties of the first embodiment described above.

Figure 7:
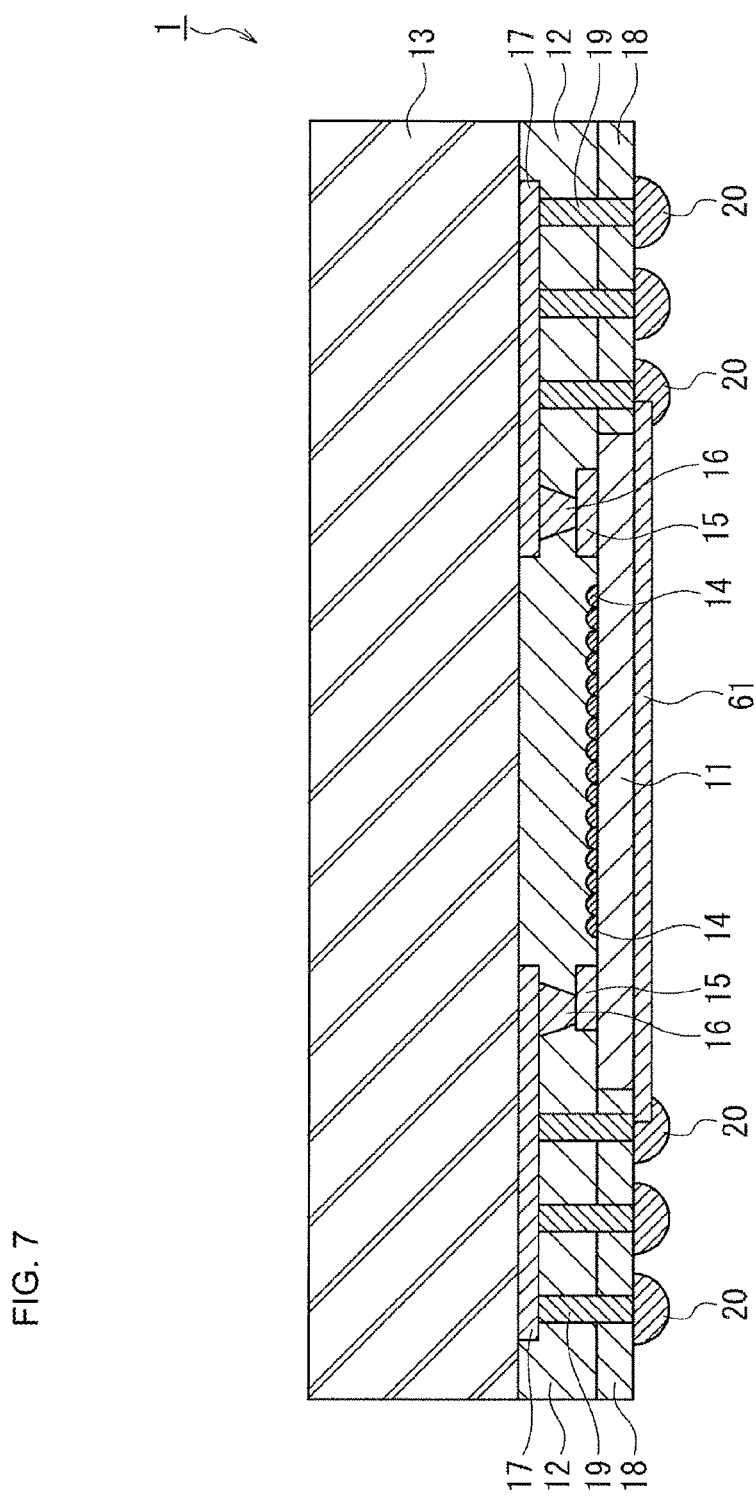
FIG. 7 is a cross-sectional view of a second embodiment of the image sensor PKG serving as the solid-state imaging unit to which the present disclosure is applied.

FIG. 7 is a cross-sectional view of a second embodiment of the image sensor PKG serving as the solid-state imaging unit to which the present disclosure is applied.

Components in FIG. 7 corresponding to those of the first embodiment illustrated in FIG. 1 are given the same reference signs, and description thereof is omitted. The following describes the other components.

The second embodiment in FIG. 7 is different from the first embodiment in FIG. 1 in that a metal film 61 is newly formed on the lower surface opposite to the light incidence surface of the image sensor substrate 11.

The metal film 61 is formed as a blanket over the entirety of the lower surface of the image sensor substrate 11 and is formed to be coupled to at least one of the plurality of solder balls 20 formed on the lower surface of the molding resin 18. The solder ball 20 coupled to the metal film 61 serves as a GND terminal, for example.

It should be noted that an insulating film may be formed between the lower surface of the image sensor substrate 11 and the metal film 61 as necessary depending on, for example, whether a semiconductor substrate of the image sensor substrate 11 is of p-type or n-type.

A configuration such as that of the second embodiment in which the metal film 61 is formed on the lower surface of the image sensor substrate 11 and a portion of the solder balls 20 is coupled to the metal film 61 enables the image sensor PKG 1 to efficiently exhaust heat generated therein through the solder ball 20 coupled to the metal film 61, improving thermal dissipation properties.

Modification Examples of Second Embodiment

Next, a modification example of the second embodiment is described.

Figure 8:
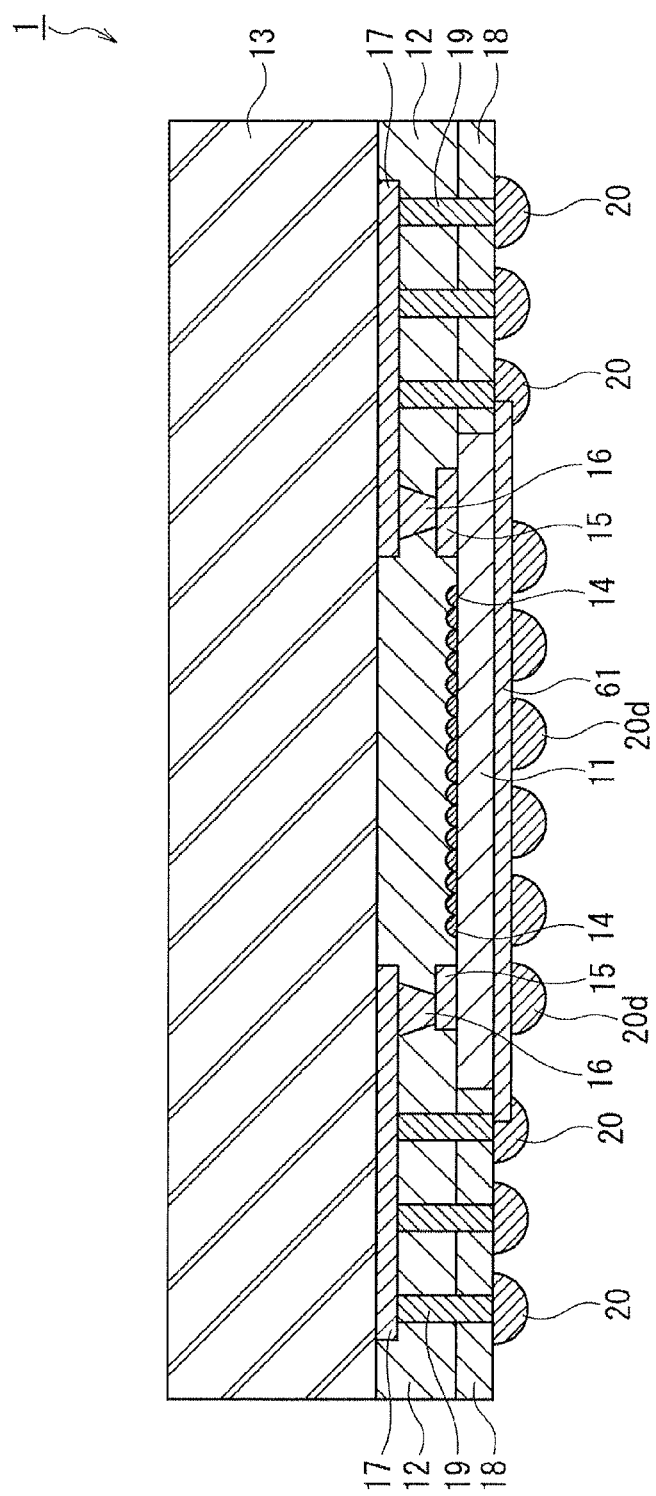
FIG. 8 is a cross-sectional view illustrating a modification example of the second embodiment.

FIG. 8 is a cross-sectional view illustrating a modification example of the second embodiment.

Components in FIG. 8 corresponding to those of the second embodiment illustrated in FIG. 7 are given the same reference signs, and description thereof is omitted. The following describes the other components.

In the second embodiment illustrated in FIG. 7, nothing is formed on a surface of the metal film 61 on the lower surface of the image sensor substrate 11, but a plurality of dummy solder balls 20d is formed in the modification example illustrated in FIG. 8.

That is, the plurality of solder balls 20d formed on the surface of the metal film 61 is not terminals for inputting and outputting signals, power-supply voltage, and the like necessary for control of the image sensor substrate 11, but terminals for improving thermal dissipation properties. It should be noted that the dummy solder balls 20d may be coupled to GND potential.

Production Method of Second Embodiment

Next, a method of producing the image sensor PKG 1 according to the second embodiment is described with reference to FIG. 9.

Steps in the method of producing the image sensor PKG 1 according to the second embodiment include similar steps to the steps in A of FIG. 3 to C of FIG. 4 described regarding the production method of the first embodiment. A of FIG. 9 illustrates the same state as C of FIG. 4 described regarding the production method of the first embodiment.

Figure 9:
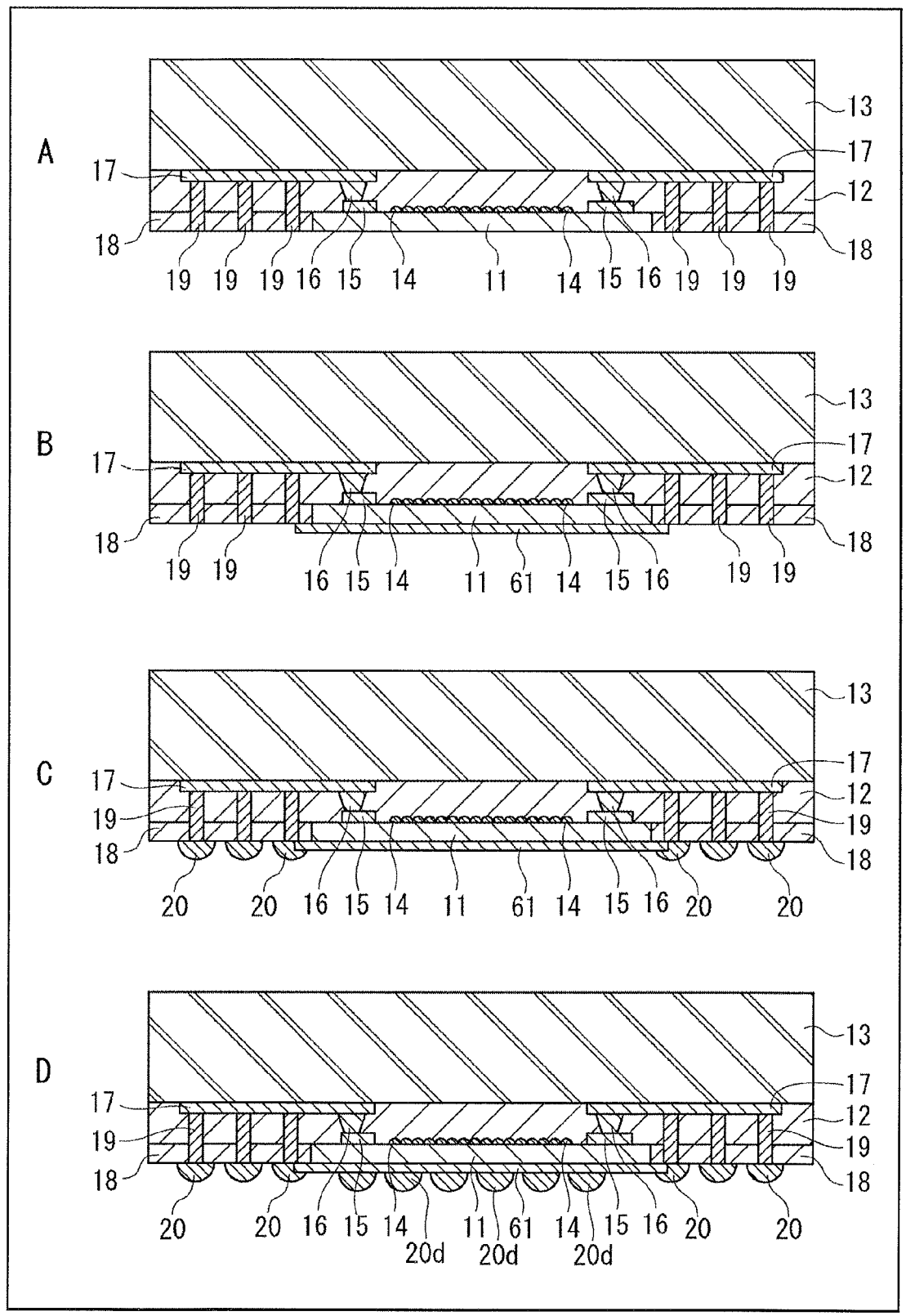
FIG. 9 is a diagram describing a method of producing the image sensor PKG according to the second embodiment.

After the plurality of through electrodes 19 is formed in the flat region where the molding resin 18 is formed as in A of FIG. 9, the metal film 61 is formed on the lower surface of the image sensor substrate 11 as illustrated in B of FIG. 9. It should be noted that the metal film 61 may be formed concurrently with the rewiring lines 21 formed on the surface of the molding resin 18, or may be formed separately.

Next, as illustrated in C of FIG. 9, the solder balls 20 serving as external terminals are formed right under the through electrodes 19 or on the rewiring lines 21 coupled to the through electrodes 19 by a method such as a solder ball mounting method. Through the above, the image sensor PKG 1 according to the second embodiment illustrated in FIG. 7 is completed.

By contrast, in a case where the plurality of dummy solder balls 20d is also formed on the surface of the metal film 61 concurrently with the solder balls 20 serving as external terminals as illustrated in D of FIG. 9, the image sensor PKG 1 according to the modification example of the second embodiment illustrated in FIG. 8 is completed.

<Modification Example of Metal Film>

In the example described above, it has been described that the metal film 61 is formed as a blanket over the entirety of the lower surface of the image sensor substrate 11. However, a plurality of through holes may be formed at equal intervals within a region of the metal film 61 for stress relaxation.

Figure 10:
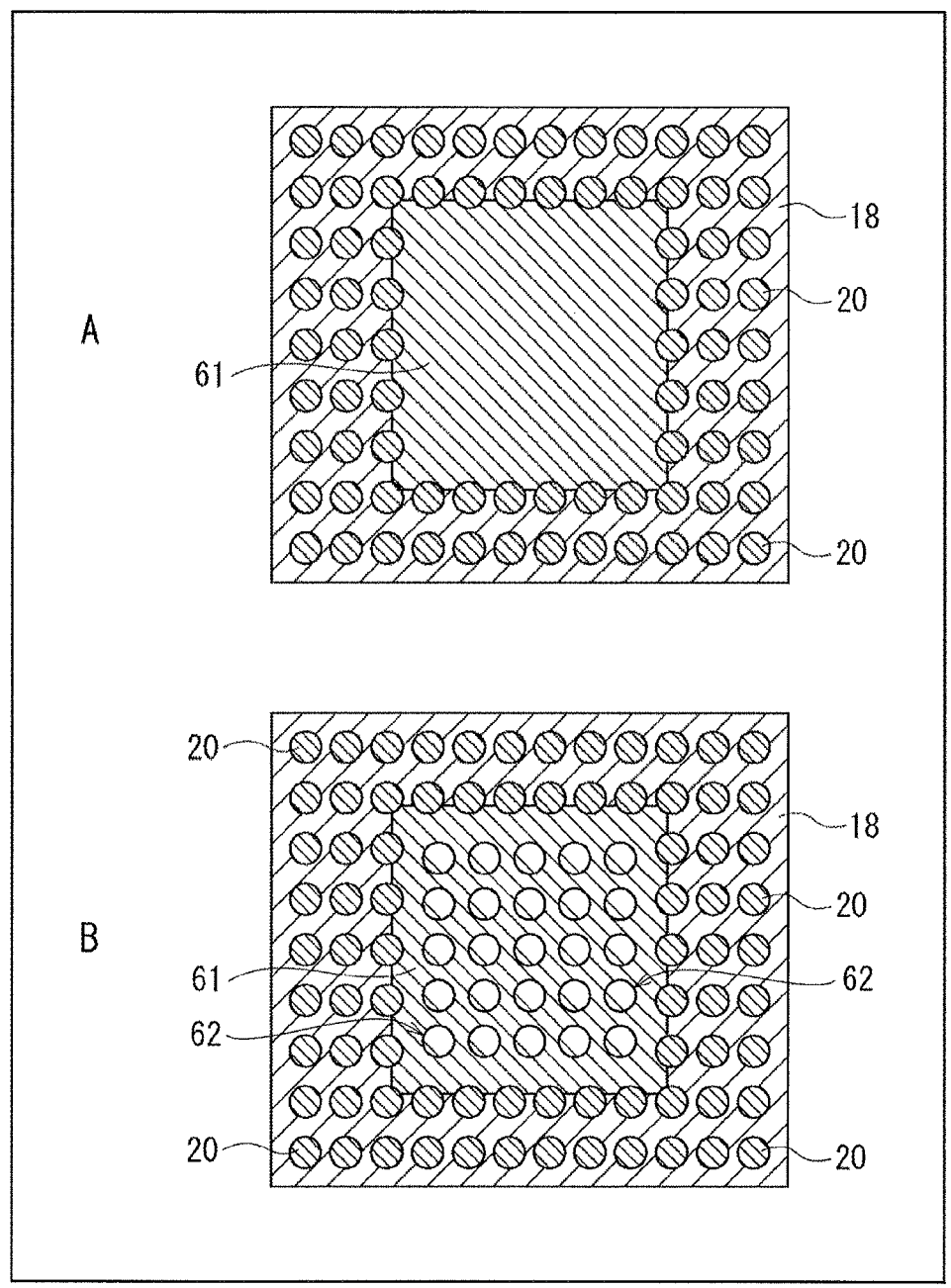
FIG. 10 is a plan view illustrating a modification example of a metal film.

A of FIG. 10 is a plan view of the entirety of a lower surface of the image sensor PKG 1 in a case where the metal film 61 is formed as a blanket.

B of FIG. 10 is a plan view of the entirety of the lower surface of the image sensor PKG 1 in a case where a plurality of through holes 62 is formed at equal intervals within the region of the metal film 61. This enables relaxation of stress such as warpage resulting from the metal film 61.

3. Third Embodiment of Solid-State Imaging Unit

<Cross-sectional View of Image Sensor PKG>

Next, a third embodiment of the image sensor PKG is described.

Figure 11:
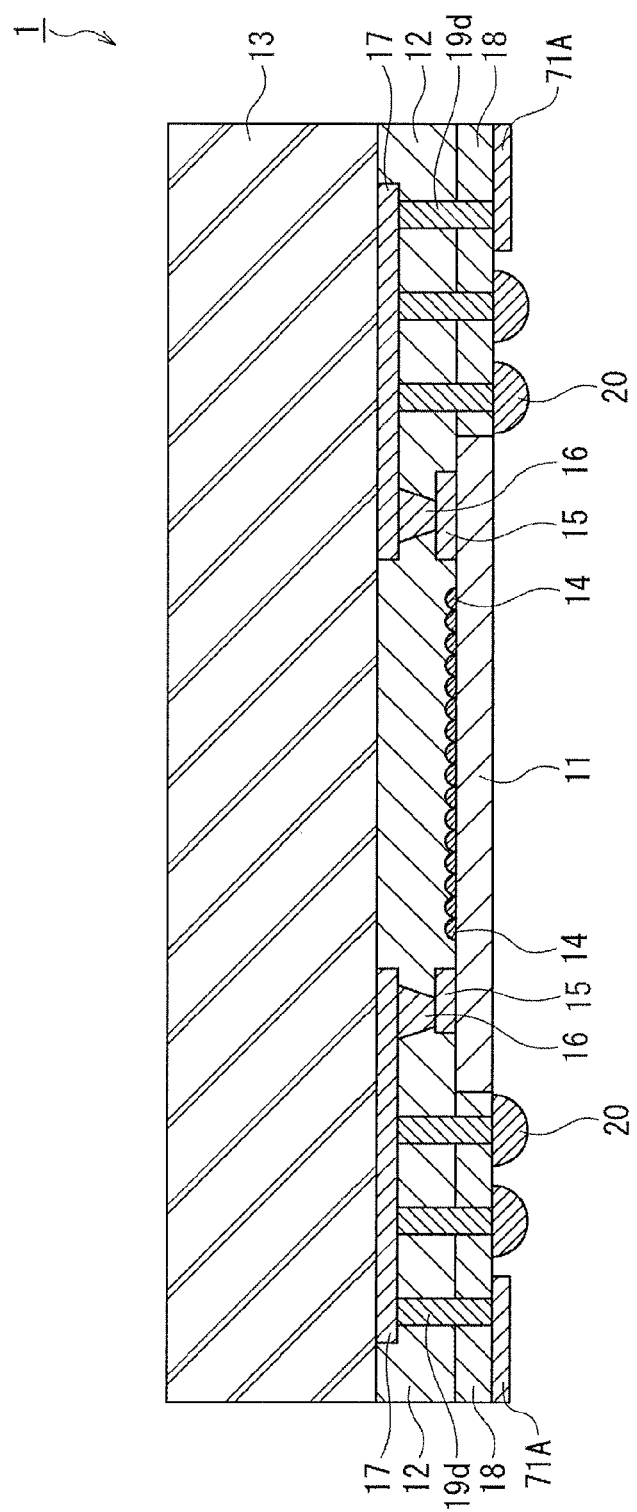
FIG. 11 is a cross-sectional view of a third embodiment of the image sensor PKG serving as the solid-state imaging unit to which the present disclosure is applied.

FIG. 11 is a cross-sectional view of a third embodiment of the image sensor PKG serving as the solid-state imaging unit to which the present disclosure is applied.

Components in FIG. 11 corresponding to those of the first embodiment illustrated in FIG. 1 are given the same reference signs, and description thereof is omitted. The following describes the other components.

The third embodiment in FIG. 11 is different from the first embodiment in FIG. 1 in that heat-dissipating plates (stiffeners) 71A are newly formed on portions of the lower surface (surface opposite to the glass substrate 13 side) of the molding resin 18 on which the plurality of solder balls 20 is formed. The heat-dissipating plates 71A each include, for example, a metal material such as stainless steel, Cu, Al, Ni, and Ti.

The heat-dissipating plates 71A are formed to be coupled to the lower surface of the molding resin 18 with an adhesive or the like and also coupled to heat-dissipating through electrodes 19d serving as portions of the through electrodes 19. The heat-dissipating through electrodes 19d are also coupled to a portion of the wiring line pattern 17 formed on the lower surface of the glass substrate 13. Heat generated from the image sensor substrate 11 is transmitted to the wiring line pattern 17, the heat-dissipating through electrodes 19d, and the heat-dissipating plates 71A, and then exhausted.

Modification Examples of Third Embodiment

Next, a modification example of the third embodiment is described.

Figure 12:
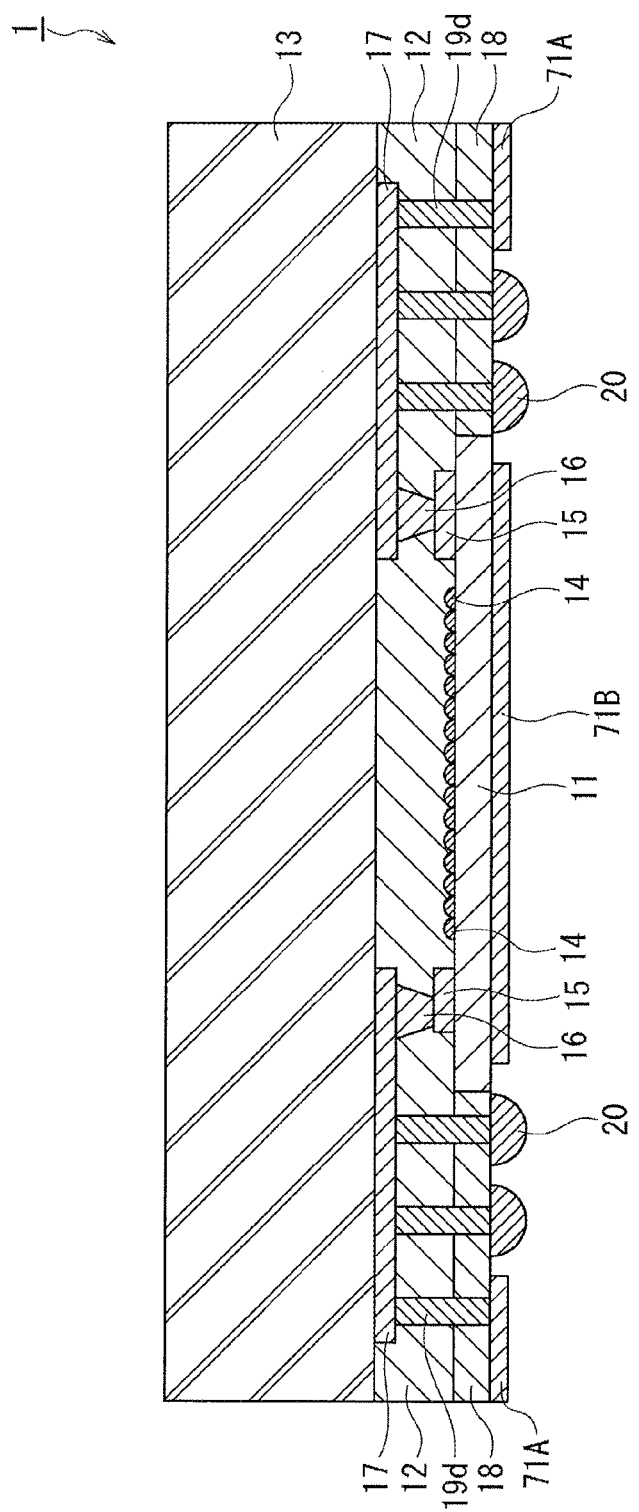
FIG. 12 is a cross-sectional view illustrating a first modification example of the third embodiment.

FIG. 12 is a cross-sectional view illustrating a first modification example of the third embodiment.

Components in FIG. 12 corresponding to those of the third embodiment illustrated in FIG. 11 are given the same reference signs, and description thereof is omitted. The following describes the other components.

In the third embodiment illustrated in FIG. 11, the heat-dissipating plates 71A are formed only on portions (for example, outer periphery portions) of the lower surface of the molding resin 18.

By contrast, in the first modification example in FIG. 12, a heat-dissipating plate 71B is also formed on the surface of the image sensor substrate 11 opposite to the glass substrate 13 side in addition to the heat-dissipating plates 71A. A material of the heat-dissipating plate 71B is the same as those of the heat-dissipating plates 71A.

Figure 13:
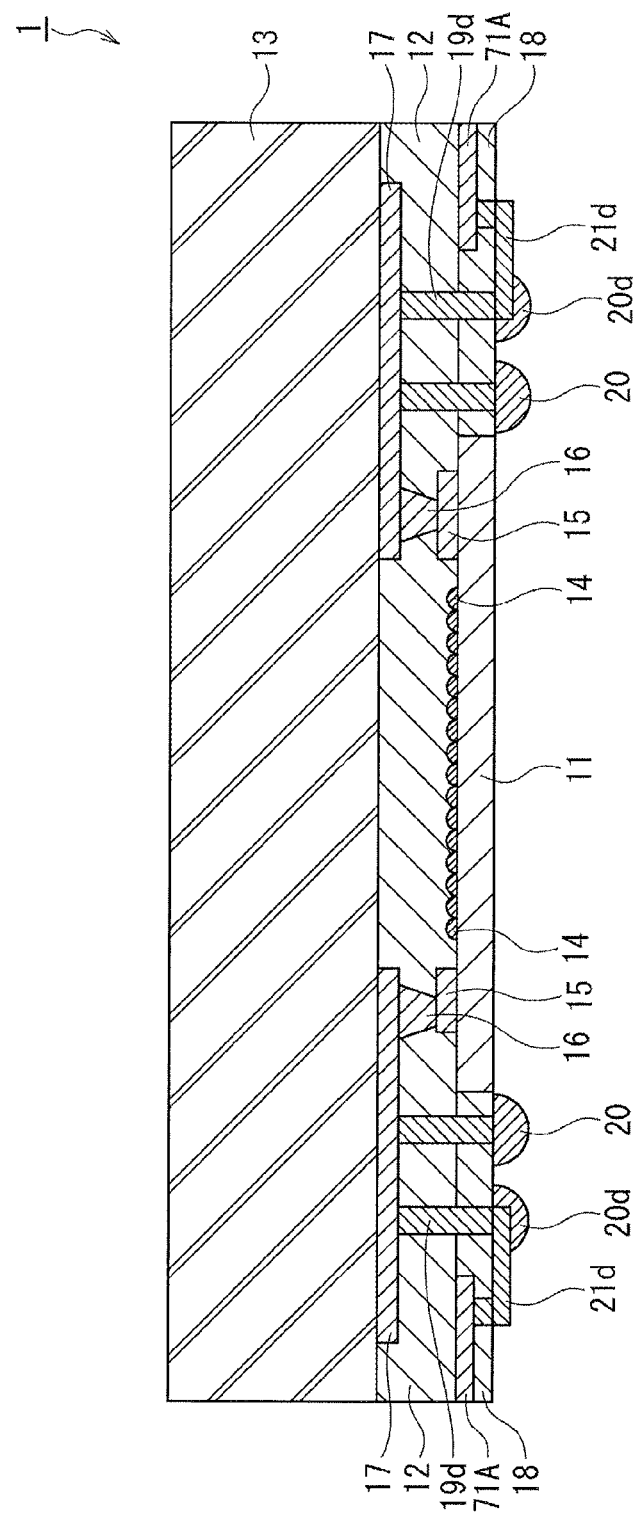
FIG. 13 is a cross-sectional view illustrating a second modification example of the third embodiment.

FIG. 13 is a cross-sectional view illustrating a second modification example of the third embodiment.

Components in FIG. 13 corresponding to those of the third embodiment illustrated in FIG. 11 are given the same reference signs, and description thereof is omitted. The following describes the other components.

In the third embodiment illustrated in FIG. 11, the heat-dissipating plates 71A are formed on the outside of the image sensor PKG 1 serving as the lower surface of the molding resin 18.

By contrast, in the second modification example in FIG. 13, the heat-dissipating plates 71A are formed between the glass adhesive resin 12 and the molding resin 18 to be covered with the molding resin 18, and formed on the inside of the image sensor PKG 1.

In FIG. 13, the heat-dissipating plates 71A are coupled to the heat-dissipating through electrodes 19d serving as portions of the through electrodes 19 and heat-dissipating rewiring lines 21d. The heat-dissipating through electrodes 19d are also formed to be coupled to a portion of the wiring line pattern 17 formed on the lower surface of the glass substrate 13 and the heat-dissipating solder balls 20d. This allows heat generated from the image sensor substrate 11 to be transmitted to the wiring line pattern 17, the heat-dissipating through electrodes 19d, the heat-dissipating rewiring lines 21d, and the heat-dissipating plates 71A, and then exhausted. In addition, the heat is also exhausted from the heat-dissipating solder balls 20d.

It should be noted that the heat-dissipating plate 71B illustrated in FIG. 12 may be further added to the second modification example in FIG. 13.

Production Method of Third Embodiment

Next, a method of producing the image sensor PKG 1 according to the third embodiment is described with reference to FIG. 14.

Steps in the method of producing the image sensor PKG 1 according to the third embodiment include similar steps to the steps in A of FIG. 3 to C of FIG. 4 described regarding the production method of the first embodiment. A of FIG. 14 illustrates the same state as C of FIG. 4 described regarding the production method of the first embodiment.

Figure 14:
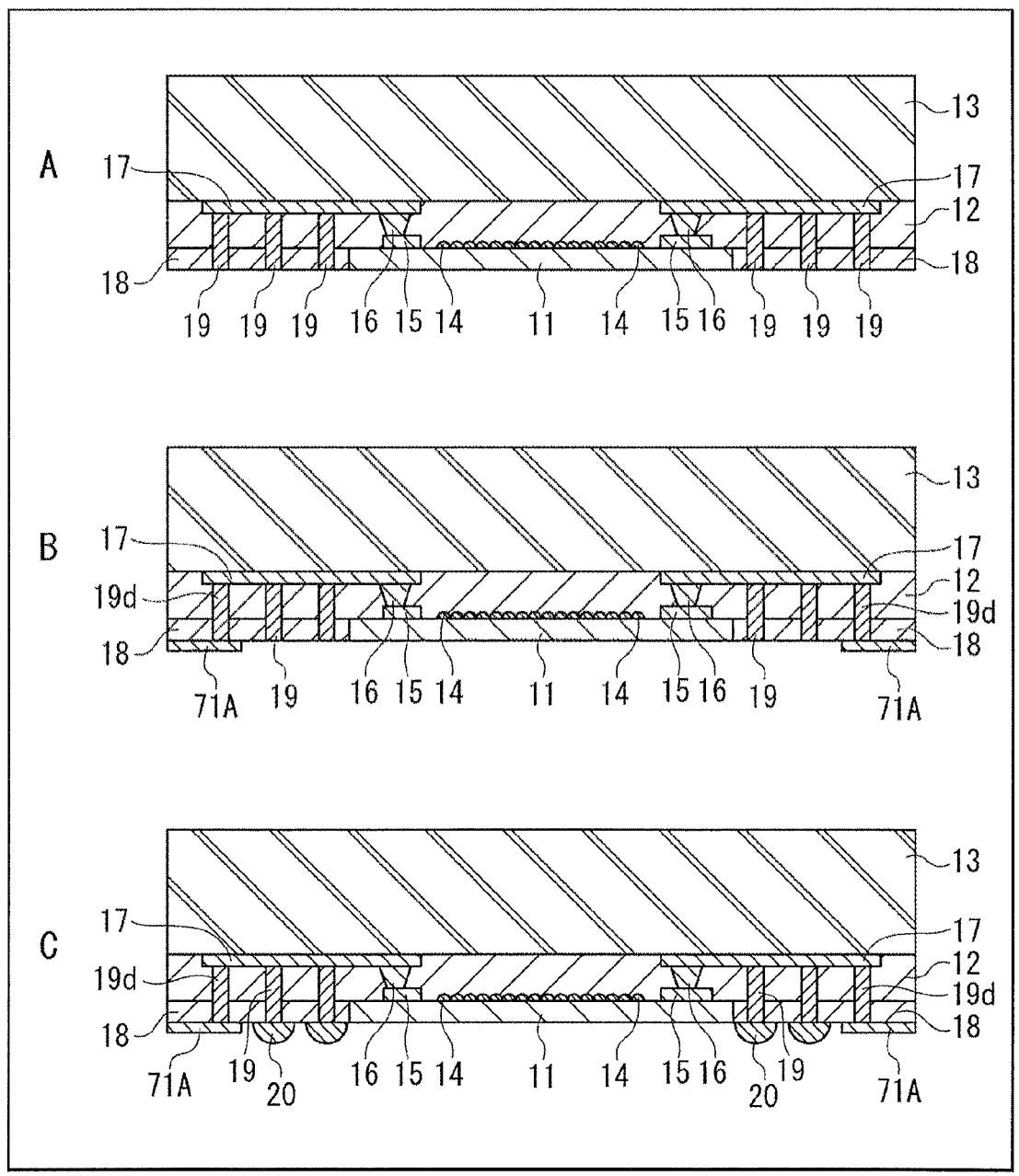
FIG. 14 is a diagram describing a method of producing the image sensor PKG according to the third embodiment.

After the plurality of through electrodes 19 is formed in the flat region where the molding resin 18 is formed as in A of FIG. 14, the heat-dissipating plates 71A are attached to portions of the lower surface of the molding resin 18 with an adhesive as illustrated in B of FIG. 14. Out of the plurality of through electrodes 19, the through electrodes 19 coupled to the heat-dissipating plates 71A serve as the heat-dissipating through electrodes 19d.

Finally, as illustrated in C of FIG. 14, the solder balls 20 serving as external terminals are formed right under the through electrodes 19 where the heat-dissipating plates 71A is not disposed or on the rewiring lines 21 coupled to the through electrodes 19 by a method such as a solder ball mounting method. Through the above, the image sensor PKG 1 according to the third embodiment illustrated in FIG. 11 is completed.

It should be noted that, in a case of the production of the image sensor PKG 1 illustrated in FIG. 12, it is sufficient if the heat-dissipating plate 71B is attached to the lower surface of the image sensor substrate 11 concurrently in the step of attaching the heat-dissipating plates 71A in B of FIG. 14. Alternatively, the heat-dissipating plates 71A and the heat-dissipating plate 71B may be attached separately rather than concurrently.

Next, a method of producing the image sensor PKG 1 according to a second modification example of the third embodiment is described with reference to FIG. 15.

Steps in the method of producing the image sensor PKG 1 according to the second modification example of the third embodiment include similar steps to the steps in A to E of FIG. 3 described regarding the production method of the first embodiment. A of FIG. 15 illustrates the same state as E of FIG. 3 described regarding the production method of the first embodiment. In this state, the singulated image sensor substrate 11 is bonded to the glass substrate 13 having the glass adhesive resin 12 applied thereto.

Figure 15:
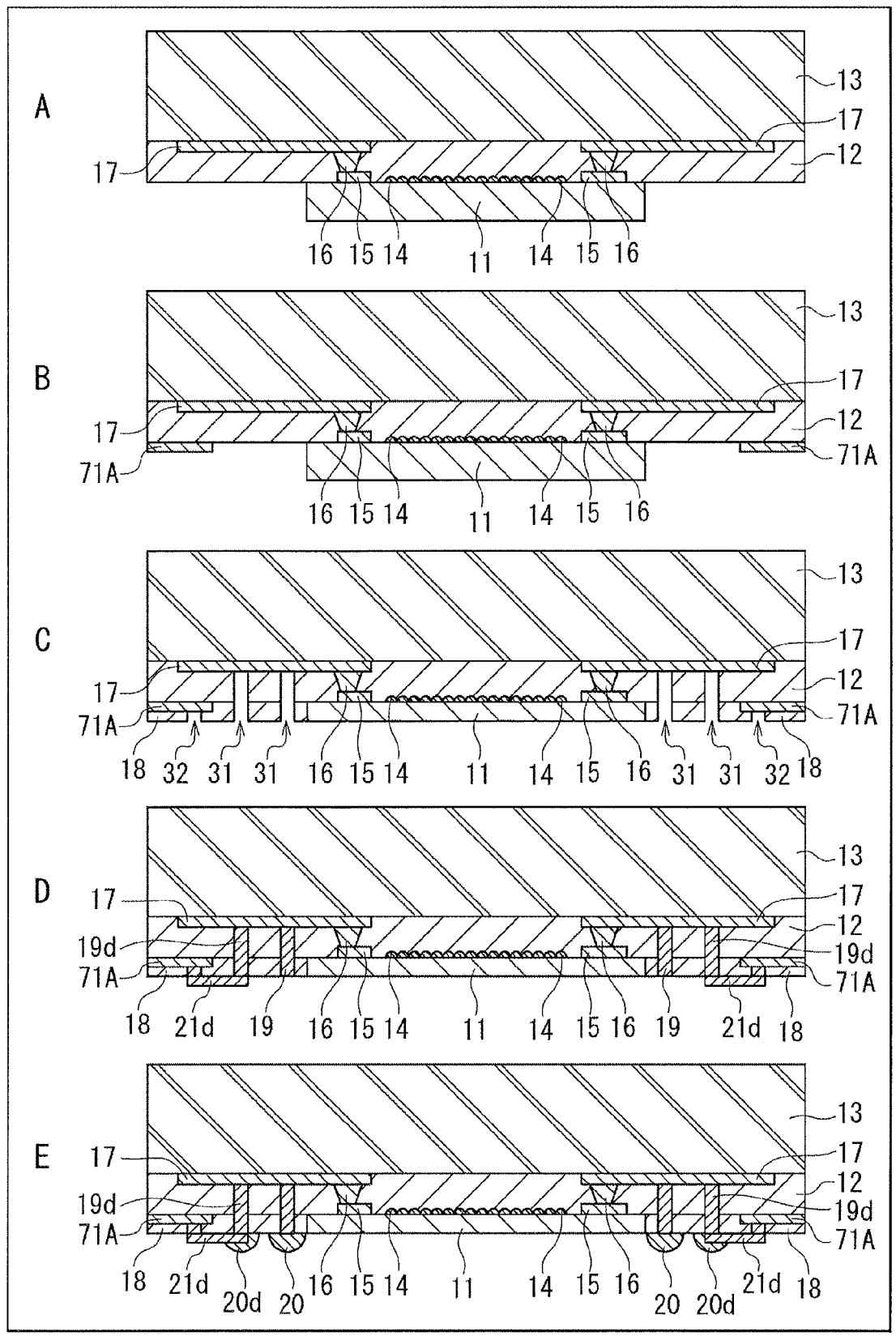
FIG. 15 is a diagram describing a method of producing an image sensor PKG according to the second modification example of the third embodiment.

After the singulated image sensor substrate 11 is bonded to the glass substrate 13 and the glass adhesive resin 12 is cured as in A of FIG. 15, the heat-dissipating plates 71A are attached to portions of the lower surface of the glass adhesive resin 12 with an adhesive as illustrated in B of FIG. 15.

Next, although not illustrated, the molding resin 18 is applied to the image sensor substrate 11 and a region (including surfaces on which the heat-dissipating plates 71A are formed) of the glass adhesive resin 12 therearoud, and then cured similarly to the step illustrated in F of FIG. 3. Thereafter, similarly to the step illustrated in A of FIG. 4, the molding resin 18 and the image sensor substrate 11 are grinded with a backgrinder and thinned to a predetermined thickness.

Subsequently, after both the molding resin 18 and the image sensor substrate 11 are thinned to a predetermined thickness, the through holes 31 that penetrate the molding resin 18 and the glass adhesive resin 12 are formed in a predetermined region where the molding resin 18 is formed as illustrated in C of FIG. 15. Specifically, the predetermined region is a portion in which the through electrodes 19 are to be formed. This step is similar to the step illustrated in B of FIG. 4. In this step, the molding resin 18 is etched at portions in contact with the heat-dissipating plates 71A to form openings 32.

Next, as illustrated in D of FIG. 15, each of the plurality of through holes 31 formed in the flat region of the molding resin 18 is filled with a metal material to serve as an electrode, and thus the through electrodes 19 are formed. Furthermore, the rewiring lines 21 (not illustrated) are formed on the surface of the molding resin 18 as necessary, and the openings 32 are also filled with a metal material.

Out of the plurality of formed through electrodes 19, the through electrodes 19 coupled to the heat-dissipating plates 71A serve as the heat-dissipating through electrodes 19d. Out of the plurality of formed rewiring lines 21, the rewiring lines 21 coupled to the heat-dissipating through electrodes 19d and the heat-dissipating plates 71A serve as the heat-dissipating rewiring lines 21d.

Finally, as illustrated in E of FIG. 15, the solder balls 20 serving as external terminals are formed right under the through electrodes 19 or on the rewiring lines 21 coupled to the through electrodes 19 by a method such as a solder ball mounting method.

Out of the solder balls 20 formed in association with the respective through electrodes 19, the solder balls 20 coupled to the heat-dissipating through electrodes 19d or the heat-dissipating rewiring lines 21d serve as the heat-dissipating solder balls 20d.

Through the above, the image sensor PKG 1 according to the second modification example of the third embodiment is completed.

As described above, the image sensor PKG 1 according to any of the first to third embodiments and the modification examples thereof has a so-called Fan-out package structure in which the solder balls 20 are provided as external terminals outside (the outer periphery portion of) the image sensor substrate 11 in the plane direction to input and output input/output signals, power, and the like of the image sensor substrate 11 through the solder balls 20. This structure enables the image sensor PKG 1 to have an increased number of terminals.

Furthermore, the image sensor PKG 1 is cavity-less because the glass adhesive resin 12 completely fills the gaps between the glass substrate 13, and the image sensor substrate 11 and the molding resin 18 opposed thereto. This causes strong resistance to stress resulting from the step of thinning the image sensor substrate 11 and allows the image sensor substrate 11 to be thinned to the utmost, contributing to reduction in the height of the package.

Thus, the image sensor PKG 1 makes it possible to increase the number of terminals while miniaturizing a package (reduced package height).

Furthermore, it is possible to improve thermal dissipation properties by further providing at least one of the metal film 61, the heat-dissipating plates 71A, the heat-dissipating plate 71B, or the dummy solder balls 20d.

4. Configuration Example of Solid-State Imaging Unit Applicable as Image Sensor Substrate 11

A non-stacked solid-state imaging unit and a stacked solid-state imaging unit having a configuration in which a plurality of substrates is stacked as described below are applicable as the above-described image sensor substrate 11.

Figure 16:
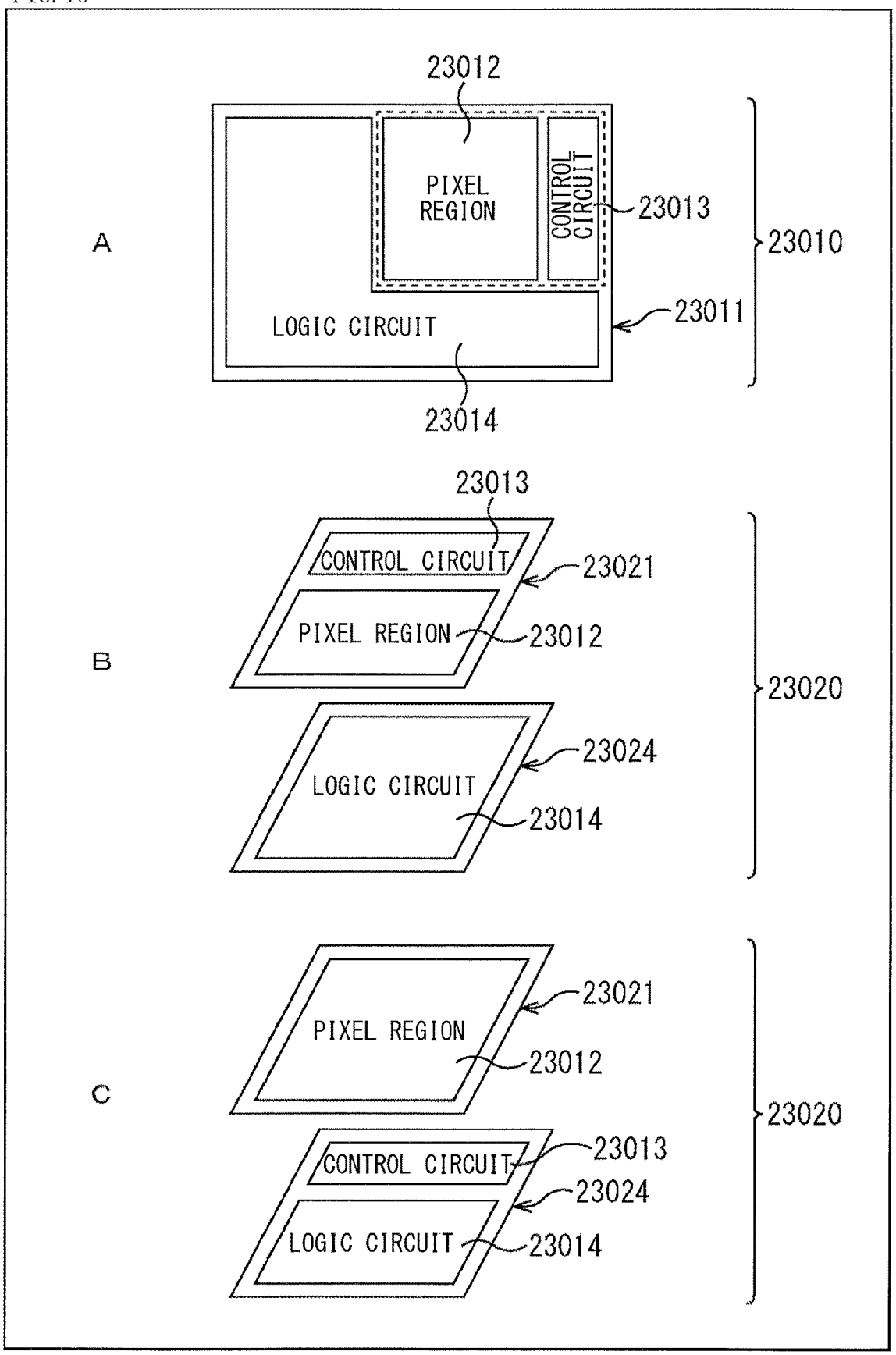
FIG. 16 is a diagram illustrating an overview of a configuration example of a stacked solid-state imaging unit to which technology according to the present disclosure is applicable.

FIG. 16 is a diagram illustrating an overview of configuration examples of solid-state imaging units applicable as the image sensor substrate 11.

A of FIG. 16 illustrates an example of a schematic configuration of a non-stacked solid-state imaging unit. A solid-state imaging unit 23010 has a single die (semiconductor substrate) 23011 as illustrated in A of FIG. 16. A pixel region 23012 including arrayed pixels, a control circuit 23013 that drives the pixels and performs other various types of control, and a logic circuit 23014 for signal processing are mounted on this die 23011.

B and C of FIG. 16 each illustrate an example of a schematic configuration of a stacked solid-state imaging unit. As illustrated in B and C of FIG. 14, a solid-state imaging unit 23020 includes the two stacked dies of a sensor die 23021 and a logic die 23024. The sensor die 23021 and a logic die 23024 are electrically coupled to each other and form a single semiconductor chip.

In B of FIG. 16, a pixel region 23012 and a control circuit 23013 are mounted on the sensor die 23021, and a logic circuit 23014 including a signal processing circuit that performs signal processing is mounted on the logic die 23024.

In C of FIG. 16, the pixel region 23012 is mounted on the sensor die 23021, and the control circuit 23013 and the logic circuit 23014 are mounted on the logic die 23024.

Figure 17:
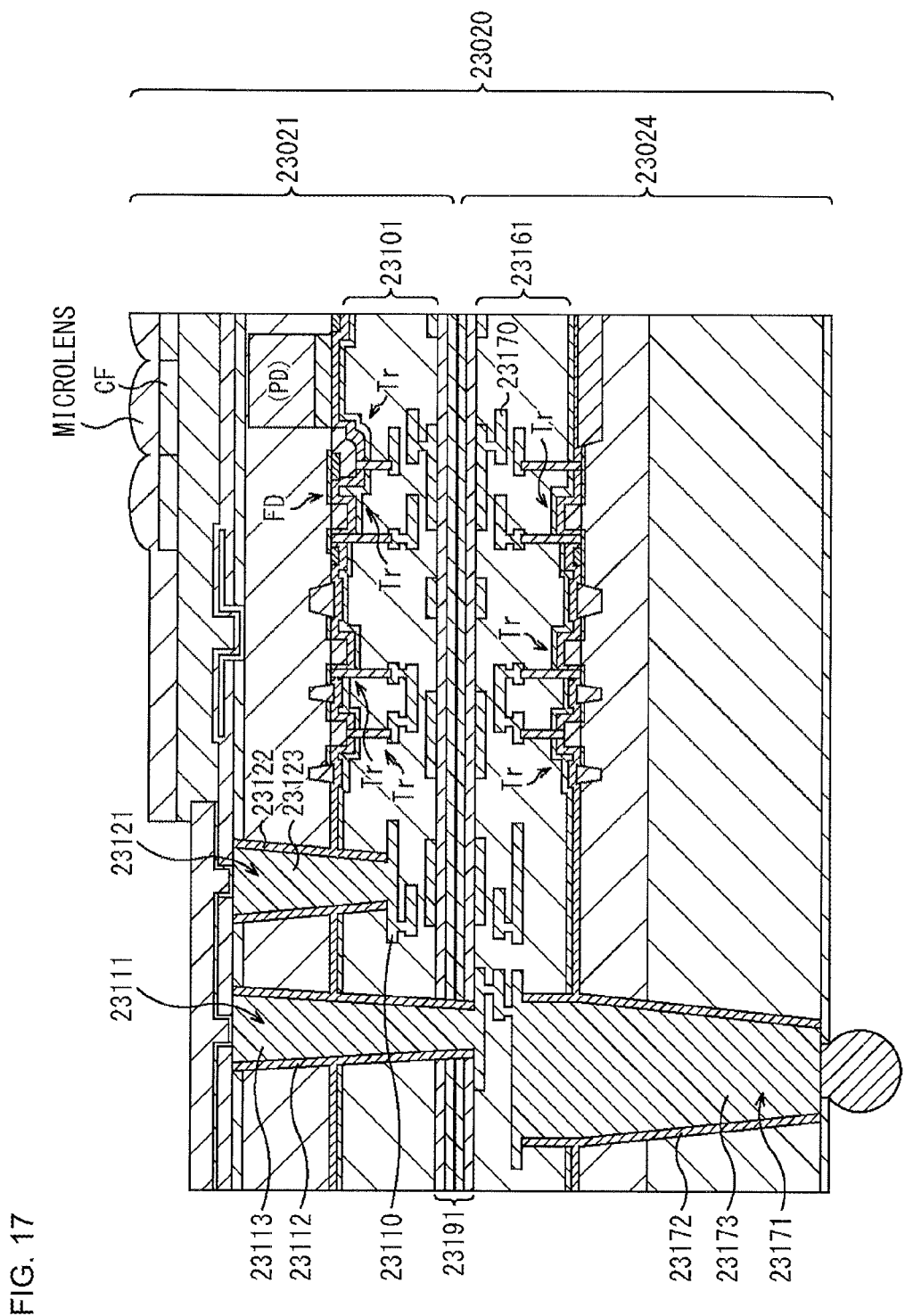
FIG. 17 is a cross-sectional view illustrating a first configuration example of a stacked solid-state imaging unit 23020.

FIG. 17 is a cross-sectional view illustrating a first configuration example of a stacked solid-state imaging unit 23020.

PD (photodiode) included in pixels serving as the pixel region 23012, FD (floating diffusion), Tr (MOS FET), Tr serving as the control circuit 23013, and the like are formed in the sensor die 23021. Furthermore, a wiring line layer 23101 having a multilayer wiring line 23110 is formed in the sensor die 23021. In this example, the multilayer wiring line 23110 is a three-layer wiring line. It should be noted that (Tr serving as) the control circuit 23013 may be included in the logic die 23024 instead of the sensor die 23021.

Tr included in the logic circuit 23014 is formed in the logic die 23024. Furthermore, a wiring line layer 23161 having a multilayer wiring line 23170 is formed in the logic die 23024. In this example, the multilayer wiring line 23110 is a three-layer wiring line. In addition, a contact hole 23171 having an insulating film 23172 formed on an inner wall surface thereof is formed in the logic die 23024, and an interconnecting conductor 23173 to be coupled to the wiring lines 23170 and the like is embedded in the contact hole 23171.

The sensor die 23021 and the logic die 23024 are bonded together with the respective wiring line layers 23101 and 23161 facing each other, thereby forming the stacked solid-state imaging unit 23020 in which the sensor die 23021 and the logic die 23024 are stacked. A film 23191 such as a protective film is formed on a bonding surface between the sensor die 23021 and the logic die 23024.

A contact hole 23111 is formed in the sensor die 23021. The contact hole 23111 penetrates the sensor die 23021 from a back surface side (side where light enters the PD) (upper side) of the sensor die 23021 and reaches the wiring line 23170 in the uppermost layer of the logic die 23024. Furthermore, a contact hole 23121 is formed in the sensor die 23021. The contact hole 23121 is located adjacent to the contact hole 23111 and reaches the wiring line 23110 in the first layer from the back surface side of the sensor die 23021. An insulating film 23112 is formed on an inner wall surface of the contact hole 23111, and an insulating film 23122 is formed on an inner wall surface of the contact hole 23121. Interconnecting conductors 23113 and 23123 are then embedded in the contact holes 23111 and 23121, respectively. The interconnecting conductors 23113 and 23123 are electrically coupled to each other on the back surface side of the sensor die 23021, and thus the sensor die 23021 and the logic die 23024 are electrically coupled to each other through the wiring line layer 23101, the contact hole 23121, the contact hole 23111, and the wiring line layer 23161.

Figure 18:
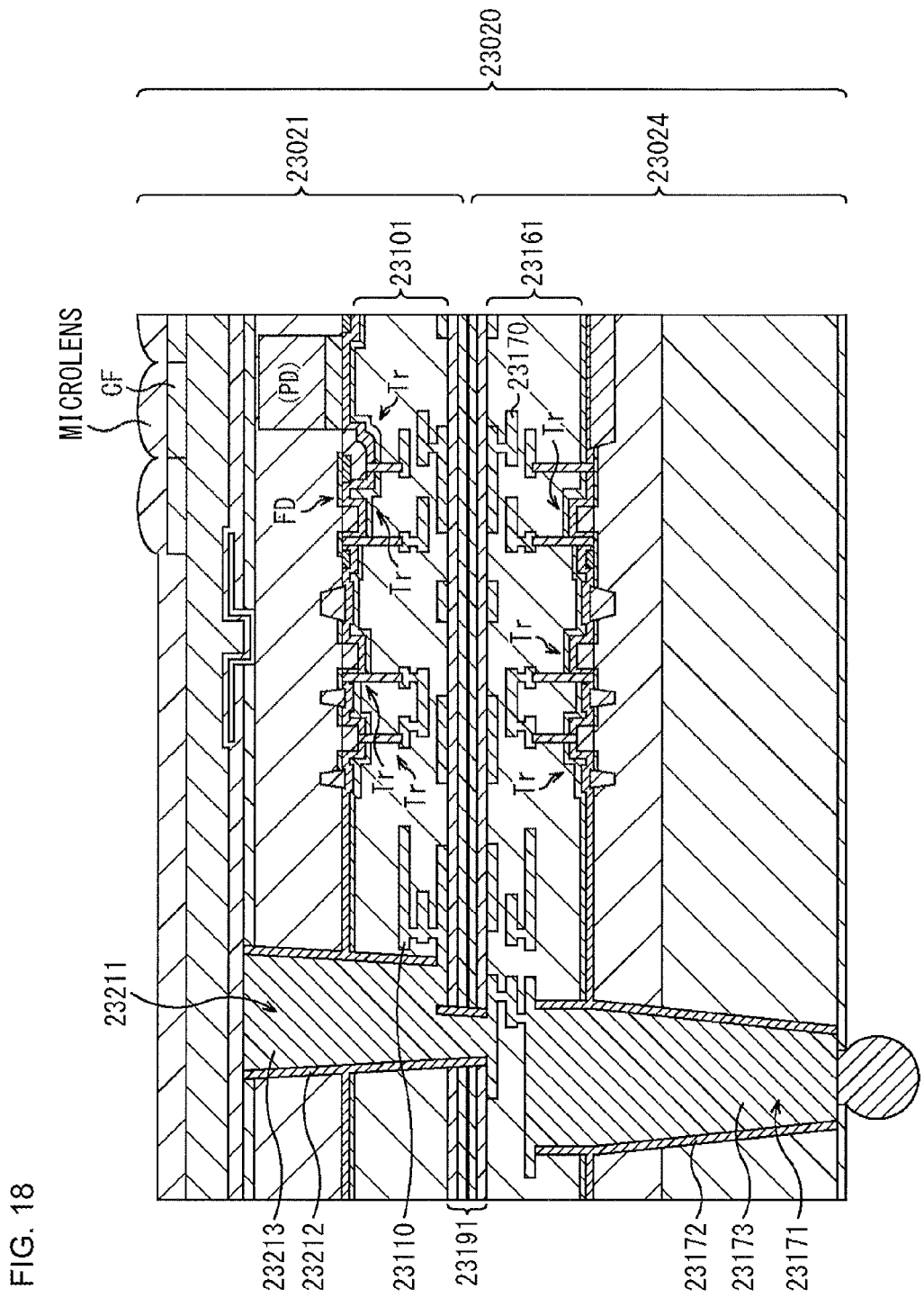
FIG. 18 is a cross-sectional view illustrating a second configuration example of the stacked solid-state imaging unit 23020.

FIG. 18 is a cross-sectional view illustrating a second configuration example of the stacked solid-state imaging unit 23020.

In the second configuration example of the solid-state imaging unit 23020, one contact hole 23211 formed in the sensor die 23021 electrically couples ((the wiring lines 23110 of) the wiring line layer 23101 of) the sensor die 23021 and ((the wiring lines 23170 of) the wiring line layer 23161 of) the logic die 23024 to each other.

That is, the contact hole 23211 is formed to penetrate the sensor die 23021 from the back surface side of the sensor die 23021, and reach the wiring line 23170 in the uppermost layer of the logic die 23024 and also reach the wiring line 23110 in the uppermost layer of the sensor die 23021 in FIG. 18. An insulating film 23212 is formed on an inner wall surface of the contact hole 23211, and an interconnecting conductor 23213 is embedded in the contact hole 23211. The sensor die 23021 and the logic die 23024 are electrically coupled to each other by the two contact holes 23111 and 23121 in FIG. 17 described above, but the sensor die 23021 and the logic die 23024 are electrically coupled to each other by the one contact hole 23211 in FIG. 18.

Figure 19:
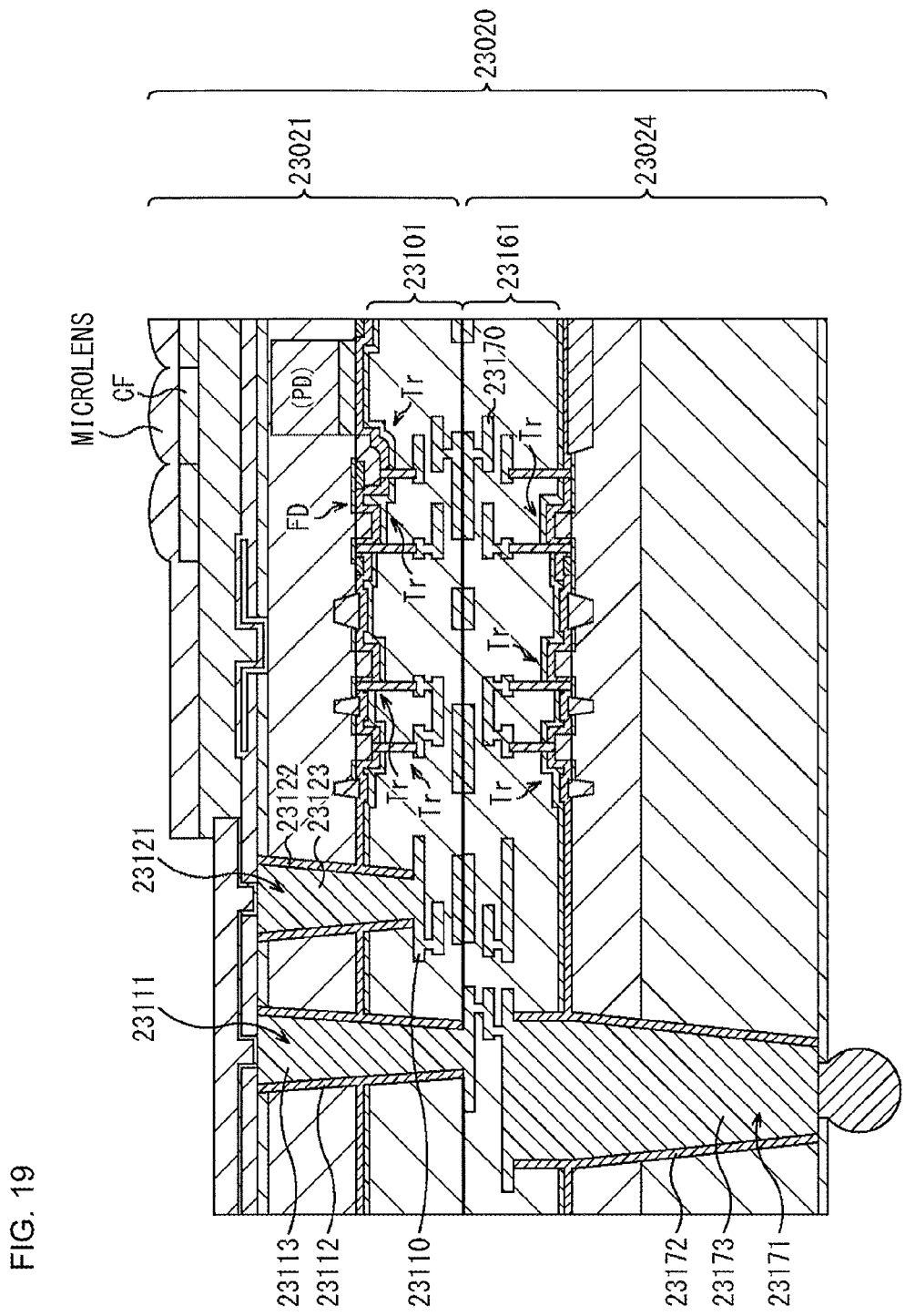
FIG. 19 is a cross-sectional view illustrating a third configuration example of the stacked solid-state imaging unit 23020.

FIG. 19 is a cross-sectional view illustrating a third configuration example of the stacked solid-state imaging unit 23020.

The solid-state imaging unit 23020 in FIG. 19 is different from the case in FIG. 17 in that the film 23191 such as a protective film is not formed on the bonding surface between the sensor die 23021 and the logic die 23024. In the case of FIG. 17, the film 23191 such as a protective film is formed on the bonding surface between the sensor die 23021 and the logic die 23024.

The solid-state imaging unit 23020 in FIG. 19 is formed by stacking the sensor die 23021 and the logic die 23024 to bring the wiring lines 23110 and 23170 into direct contact with each other, and applying specific load and heat thereto to directly join the wiring lines 23110 and 23170 together.

Figure 20:
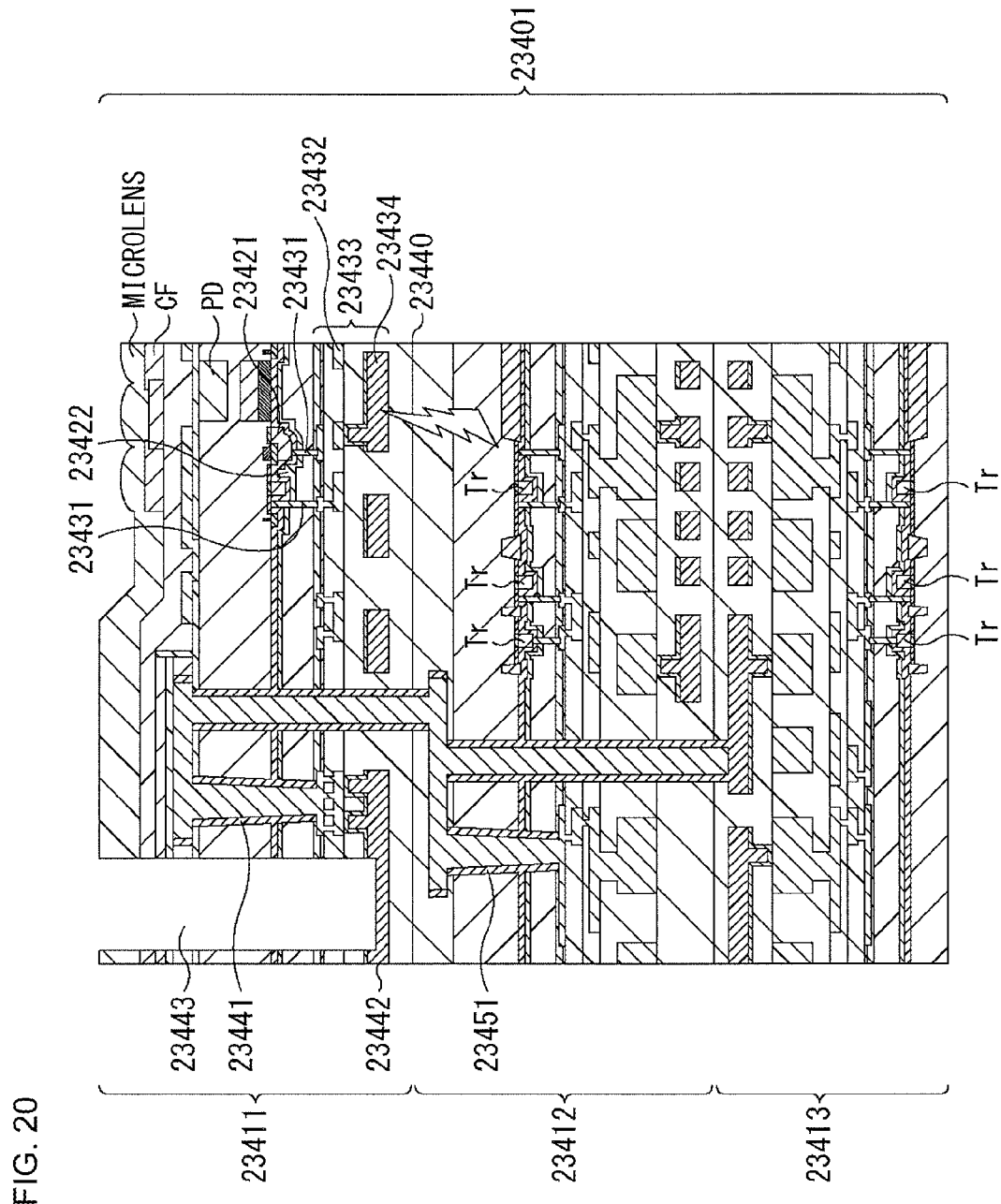
FIG. 20 is a cross-sectional view illustrating another configuration example of the stacked solid-state imaging unit to which the technology according to the present disclosure is applicable.

FIG. 20 is a cross-sectional view illustrating another configuration example of the stacked solid-state imaging unit to which the technology according to the present disclosure is applicable.

A solid-state imaging unit 23401 has a three-layer stacked structure including the three stacked dies of a sensor die 23411, a logic die 23412, and a memory die 23413 in FIG. 20.

The memory die 23413 has a memory circuit that stores data temporarily necessary, for example, in signal processing performed in the logic die 23412.

In FIG. 20, the logic die 23412 and the memory die 23413 are stacked under the sensor die 23411 in this order, but it is possible to stack the logic die 23412 and the memory die 23413 under the sensor die 23411 in the inverse order, that is, in the order of the memory die 23413 and the logic die 23412.

It should be noted that PD serving as a photoelectric conversion section of each pixel and source/drain regions of each pixel Tr are formed in the sensor die 23411 in FIG. 20.

A gate electrode is formed around the PD with a gate insulator therebetween, and the gate electrode and the paired source/drain regions form a pixel Tr 23421 and a pixel Tr 23422.

The pixel Tr 23421 adjacent to the PD is transfer Tr, and one of the paired source/drain regions included in the pixel Tr 23421 is FD.

Furthermore, an inter-layer insulating film is formed in the sensor die 23411, and contact holes are formed in the inter-layer insulating film. Interconnecting conductors 23431 coupled to the pixel Tr 23421 and the pixel Tr 23422 are formed in the respective contact holes.

Furthermore, a wiring line layer 23433 having a multi-layer wiring lines 23432 coupled to each of the interconnecting conductors 23431 is formed in the sensor die 23411.

Furthermore, an aluminum pad 23434 that serves as an electrode for external coupling is formed in the lowermost layer of the wiring line layer 23433 in the sensor die 23411. That is, the aluminum pad 23434 is formed closer to a bonding surface 23440 with the logic die 23412 than the wiring lines 23432 in the sensor die 23411. The aluminum pad 23434 is used as one end of a wiring line engaged in input and output of signals to and from the outside.

Furthermore, a contact 23441 is formed in the sensor die 23411. The contact 23441 is used for electrical coupling to the logic die 23412. The contact 23441 is coupled to a contact 23451 in the logic die 23412 and is also coupled to an aluminum pad 23442 in the sensor die 23411.

A pad hole 23443 is then formed in the sensor die 23411 to reach the aluminum pad 23442 from a back surface side (upper side) of the sensor die 23411.

The structures of the solid-state imaging unit as described above are applicable as the image sensor substrate 11.

5. Example of Application to Electronic Apparatus

The technology according to the present disclosure is not limited to application to solid-state imaging units. That is, the technology according to the present disclosure is applicable to general electronic apparatuses that use a solid-state imaging unit for an image capture section (photoelectric conversion section), including imaging apparatuses such as digital still cameras and video cameras, mobile terminals having an imaging function, copiers that use a solid-state imaging unit for an image reading section, and the like. The solid-state imaging unit may be in one-chip form or in a module form having an imaging function achieved by packaging an imaging section and a signal processing section or an optical system together.

Figure 21:
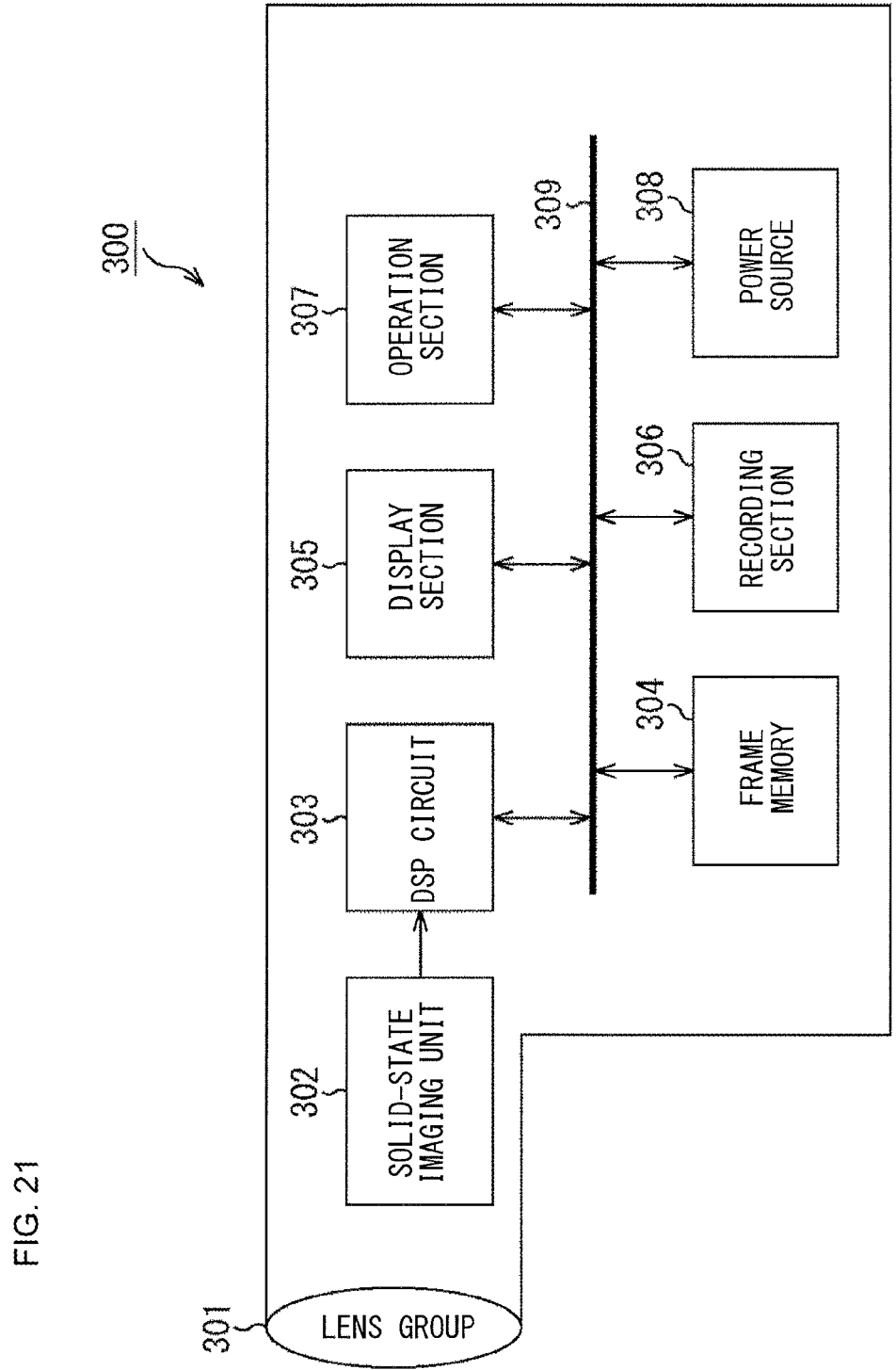
FIG. 21 is a block diagram illustrating a configuration example of an imaging apparatus serving as an electronic apparatus to which the technology according to the present disclosure is applied.

FIG. 21 is a block diagram illustrating a configuration example of an imaging apparatus serving as an electronic apparatus to which the technology according to the present disclosure is applied.

An imaging apparatus 300 in FIG. 21 includes an optical section 301 including a group of lenses, a solid-state imaging unit (imaging device) 302 adopting the configuration of the image sensor PKG 1 in FIG. 1, and a DSP (Digital Signal Processor) circuit 303 that is a camera signal processing circuit. Furthermore, the imaging apparatus 300 includes a frame memory 304, a display section 305, a recording section 306, an operation section 307, and a power source 308. The DSP circuit 303, the frame memory 304, the display section 305, the recording section 306, the operation section 307, and the power source 308 are coupled to one another through a bus line 309.

The optical section 301 captures incoming light (image light) from a subject and forms an image on an imaging plane of the solid-state imaging unit 302. The solid-state imaging unit 302 converts the amount of the incoming light for image formation on the imaging plane by the optical section 301 to an electric signal in units of pixels and outputs the electric signal as a pixel signal. It is possible to use the image sensor PKG 1 in FIG. 1, that is, an image sensor package that has an increased number of terminals while being miniaturized (reduced height) as this solid-state imaging unit 302.

The display section 305 includes, for example, a thin display such as LCD (Liquid Crystal Display) and an organic EL (Electro Luminescence) display, and displays a moving image or a still image captured by the solid-state imaging unit 302. The recording section 306 records the moving image or the still image captured by the solid-state imaging unit 302 on a recording medium such as a hard disk or a semiconductor memory.

The operation section 307 is operated by a user to issue operation instructions for various functions of the imaging apparatus 300. The power source 308 supplies the DSP circuit 303, the frame memory 304, the display section 305, the recording section 306, and the operation section 307 with various types of power for operating these targets as appropriate.

As described above, the use of image sensor PKG 1 according to the first to third embodiments or modification examples thereof described above as the solid-state imaging unit 302 makes it possible to achieve an image sensor package that has an increased number of terminals while being miniaturized (reduced height). Thus, it is possible to achieve, for example, a high-speed InterFace while miniaturizing the imaging apparatus 300 such as a video camera, a digital still camera, and further a camera module for a mobile device such as a mobile phone.

6. Usage Examples of Image Sensor

Figure 22:
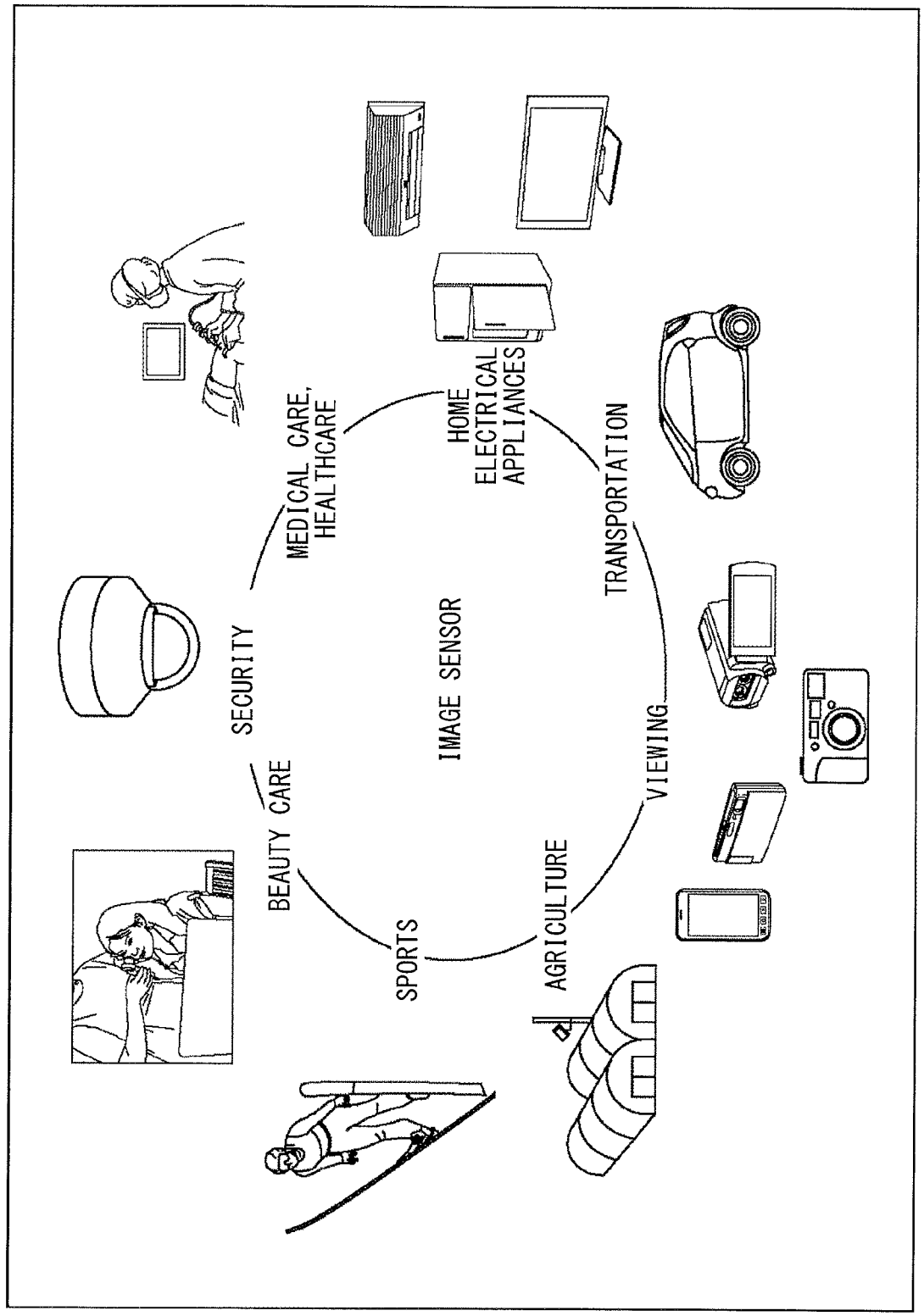
FIG. 22 is a diagram describing a usage example of an image sensor.

FIG. 22 is a diagram illustrating usage examples of an image sensor including the above-described image sensor PKG 1.

The image sensor including the above-described image sensor PKG 1 is usable, for example, in the following various cases in which light such as visible light, infrared light, ultraviolet light, and X-rays is sensed.

- Devices that shoot images for viewing such as digital cameras and mobile devices having a camera function
- Devices for traffic use such as onboard sensors that shoot images of the front, back, surroundings, inside, and so on of an automobile for safe driving such as automatic stop and for recognition of driver's state, monitoring cameras that monitor traveling vehicles and roads, and distance measuring sensors that measure vehicle-to-vehicle distance
- Devices for use in home electrical appliances such as TV, refrigerators, and air-conditioners to shoot images of a user's gesture and operate the appliances in accordance with the gesture
- Devices for medical care and healthcare use such as endoscopes and devices that shoot images of blood vessels by receiving infrared light
- Devices for security use such as monitoring cameras for crime prevention and cameras for individual authentication
- Devices for beauty care use such as skin measuring devices that shoot images of skin and microscopes that shoot images of scalp
- Devices for sports use such as action cameras and wearable cameras for sports applications
- Devices for agricultural use such as cameras for monitoring fields and crops

7. Example of Application to In-Vivo Information Acquisition System

The technology (present technology) according to the present disclosure is applicable to various products as described above. For example, the technology according to the present disclosure may be applied to an in-vivo information acquisition system of a patient using a capsule type endoscope.

Figure 23:
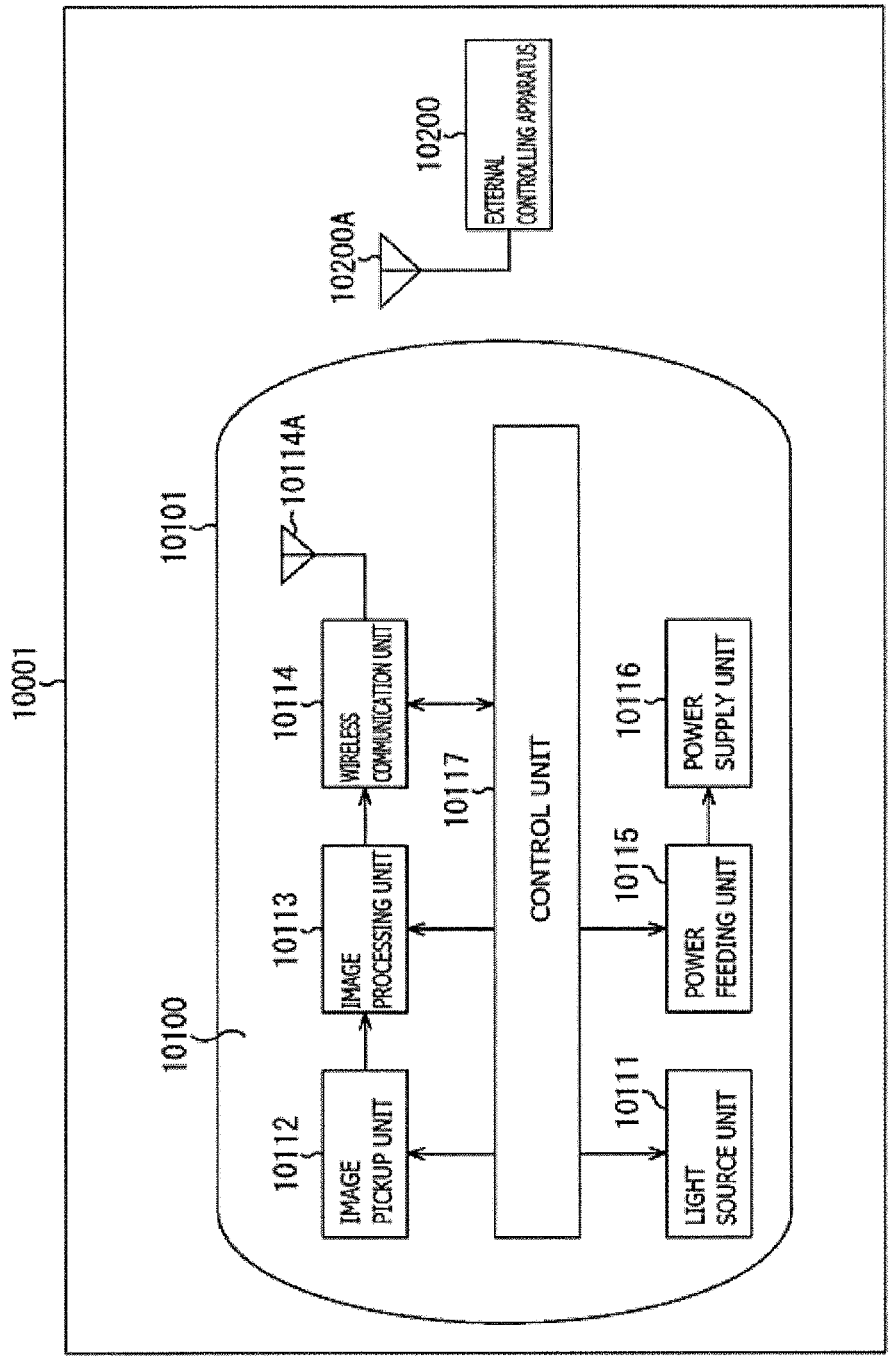
FIG. 23 is a block diagram depicting an example of a schematic configuration of an in-vivo information acquisition system.

FIG. 23 is a block diagram depicting an example of a schematic configuration of an in-vivo information acquisition system of a patient using a capsule type endoscope, to which the technology according to an embodiment of the present disclosure can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 23, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied to the image pickup unit 10112 among the components described above. Specifically, the image sensor PKG 1 described above is applicable as the image pickup unit 10112. Applying the technology according to the present disclosure to the image pickup unit 10112 allows the capsule type endoscope 10100 to be more miniaturized. This makes it possible to further reduce the burden on a patient. In addition, it is possible to increase the number of terminals while miniaturizing the capsule type endoscope 10100. This makes it possible to achieve, for example, a high-speed InterFace.

8. Example of Application to Endoscopic Surgery System

For example, the technology according to the present disclosure may be applied to an endoscopic surgery system.

Figure 24:
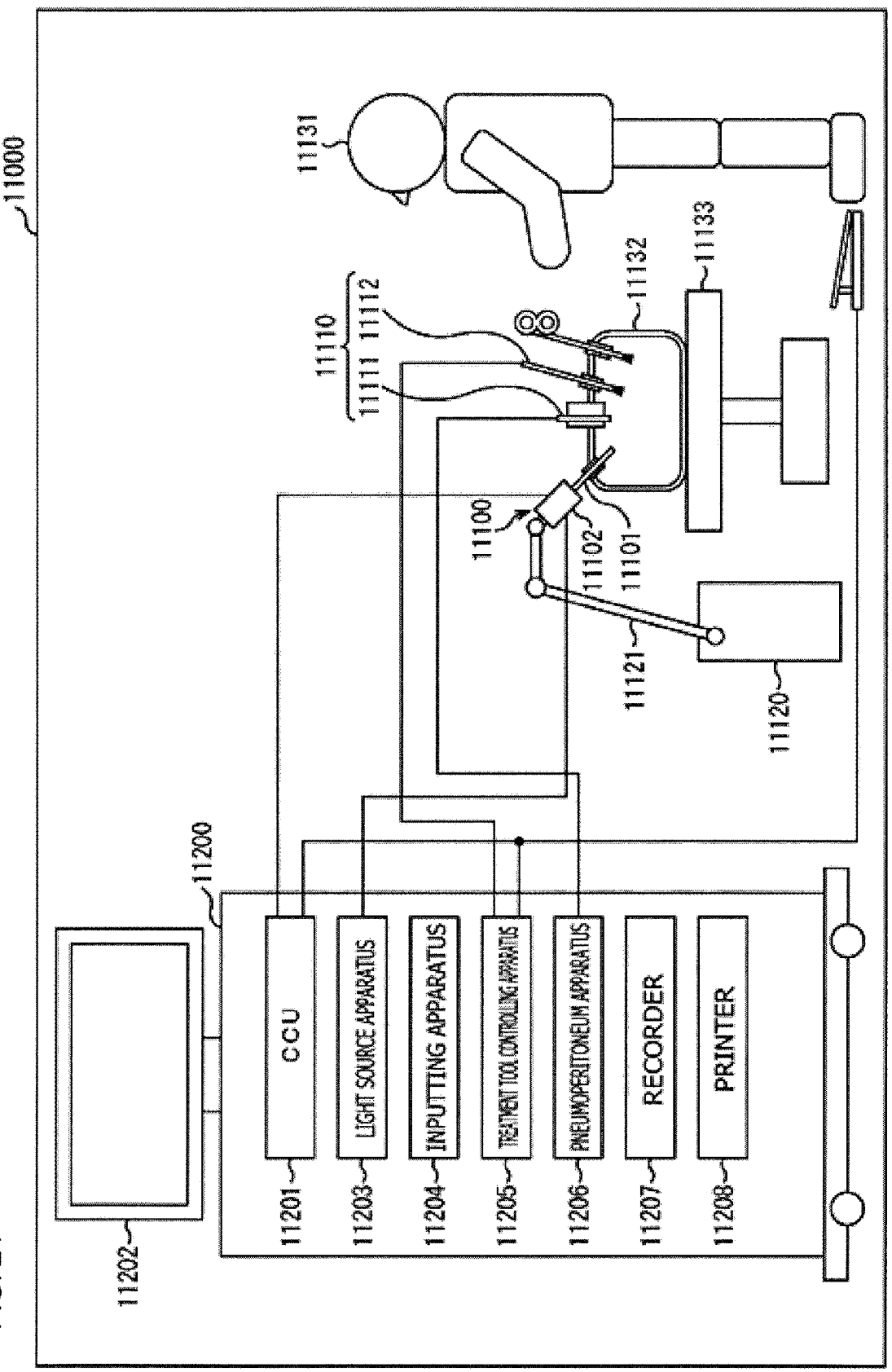
FIG. 24 is a view depicting an example of a schematic configuration of an endoscopic surgery system.

FIG. 24 is a view depicting an example of a schematic configuration of an endoscopic surgery system to which the technology according to an embodiment of the present disclosure can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 25:
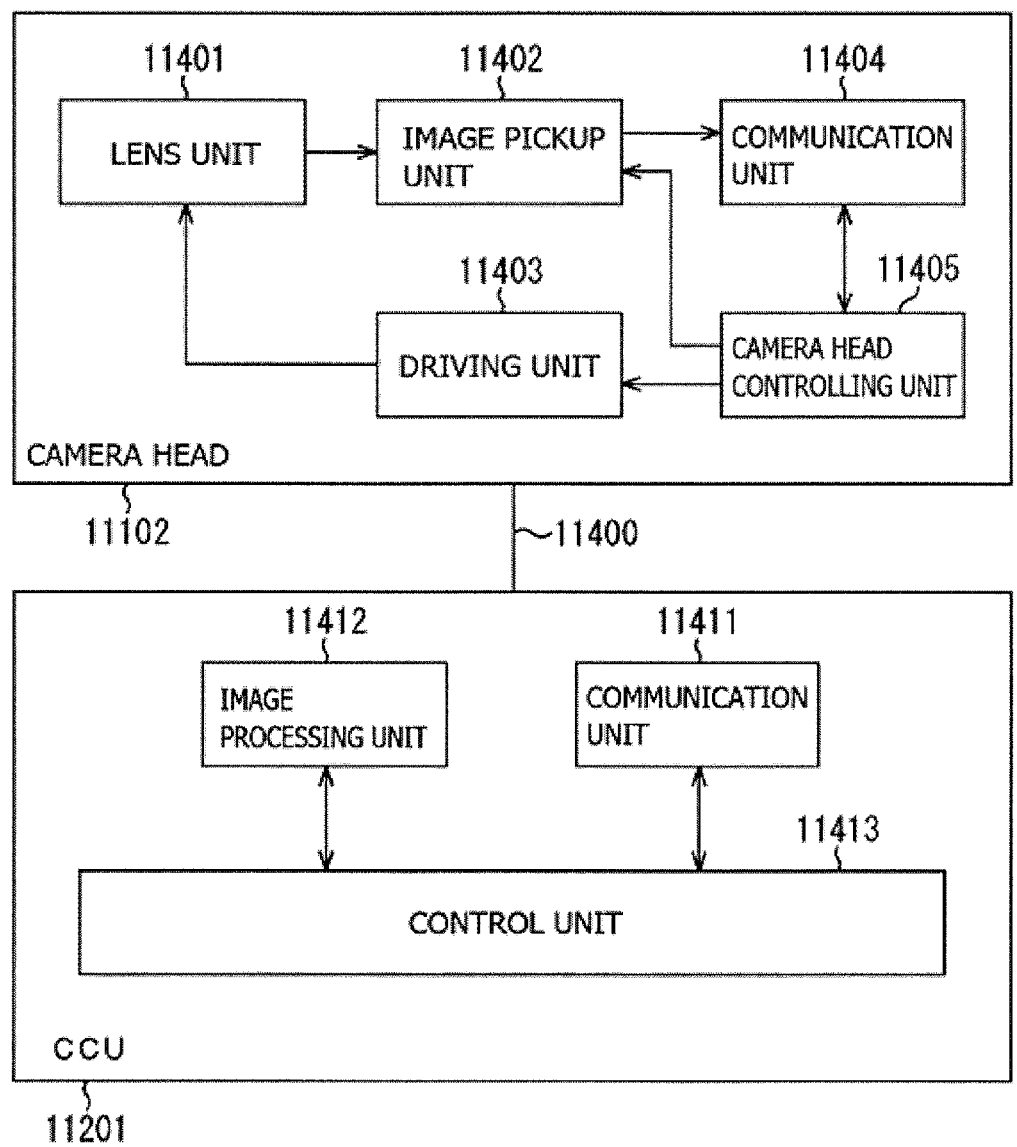
FIG. 25 is a block diagram depicting an example of a functional configuration of a camera head and a camera control unit (CCU).

FIG. 25 is a block diagram depicting an example of a functional configuration of the camera head 11102 and the CCU 11201 depicted in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to, for example, the image pickup unit 11402 of the camera head 11102 among the components described above. Specifically, the image sensor PKG 1 described above is applicable as the image pickup unit 11402. Applying the technology according to the present disclosure to the image pickup unit 11402 makes it possible to increase the number of terminals while miniaturizing the camera head 11102. This makes it possible to achieve, for example, a high-speed InterFace.

It should be noted that the endoscopic surgery system has been described here as an example, but the technology according to the present disclosure may be additionally applied to, for example, a microscopic surgery system or the like.

9. Example of Application to Mobile Body

Further, for example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

Figure 26:
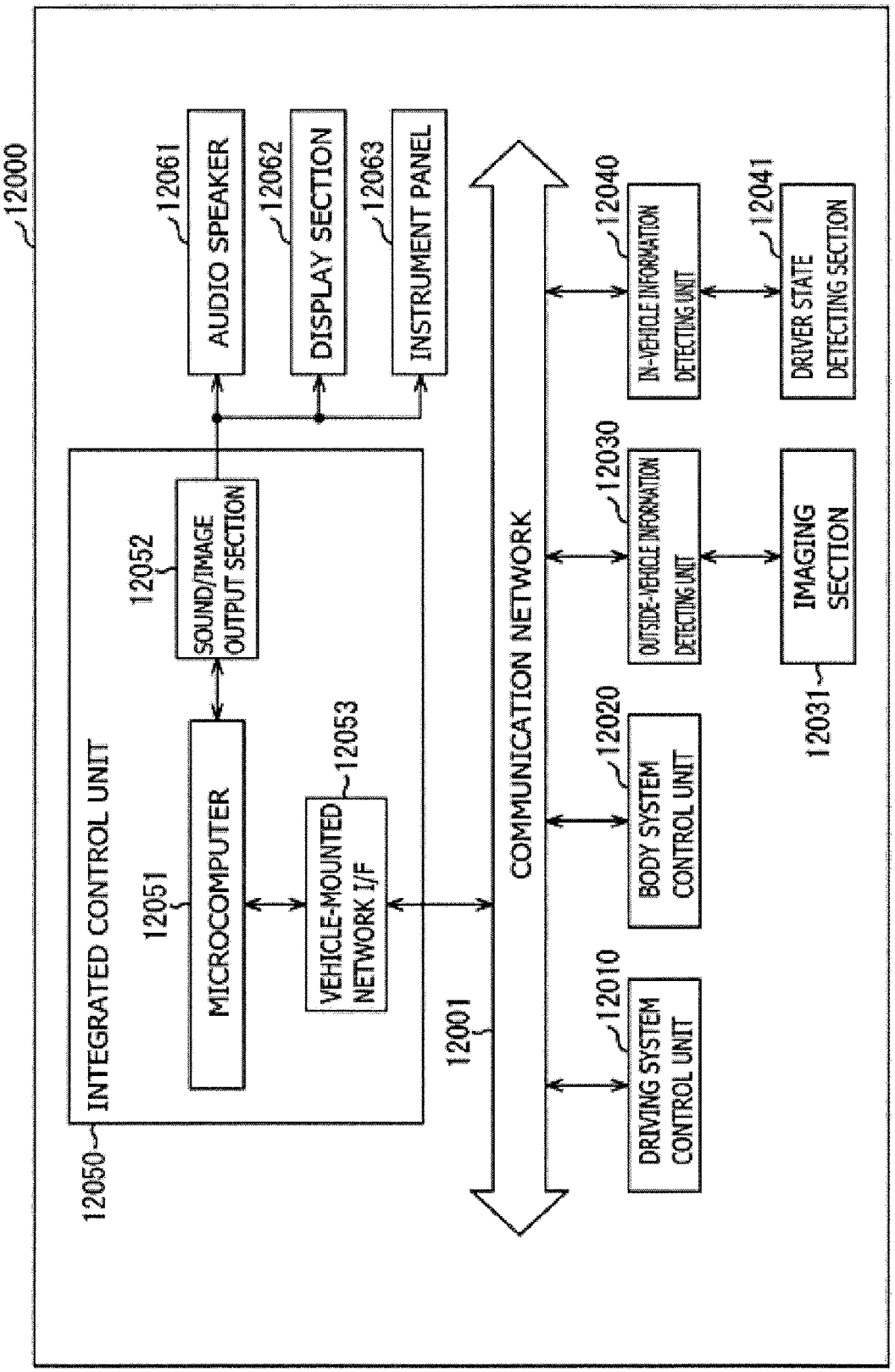
FIG. 26 is a block diagram depicting an example of schematic configuration of a vehicle control system.

FIG. 26 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 26, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display and a head-up display.

Figure 27:
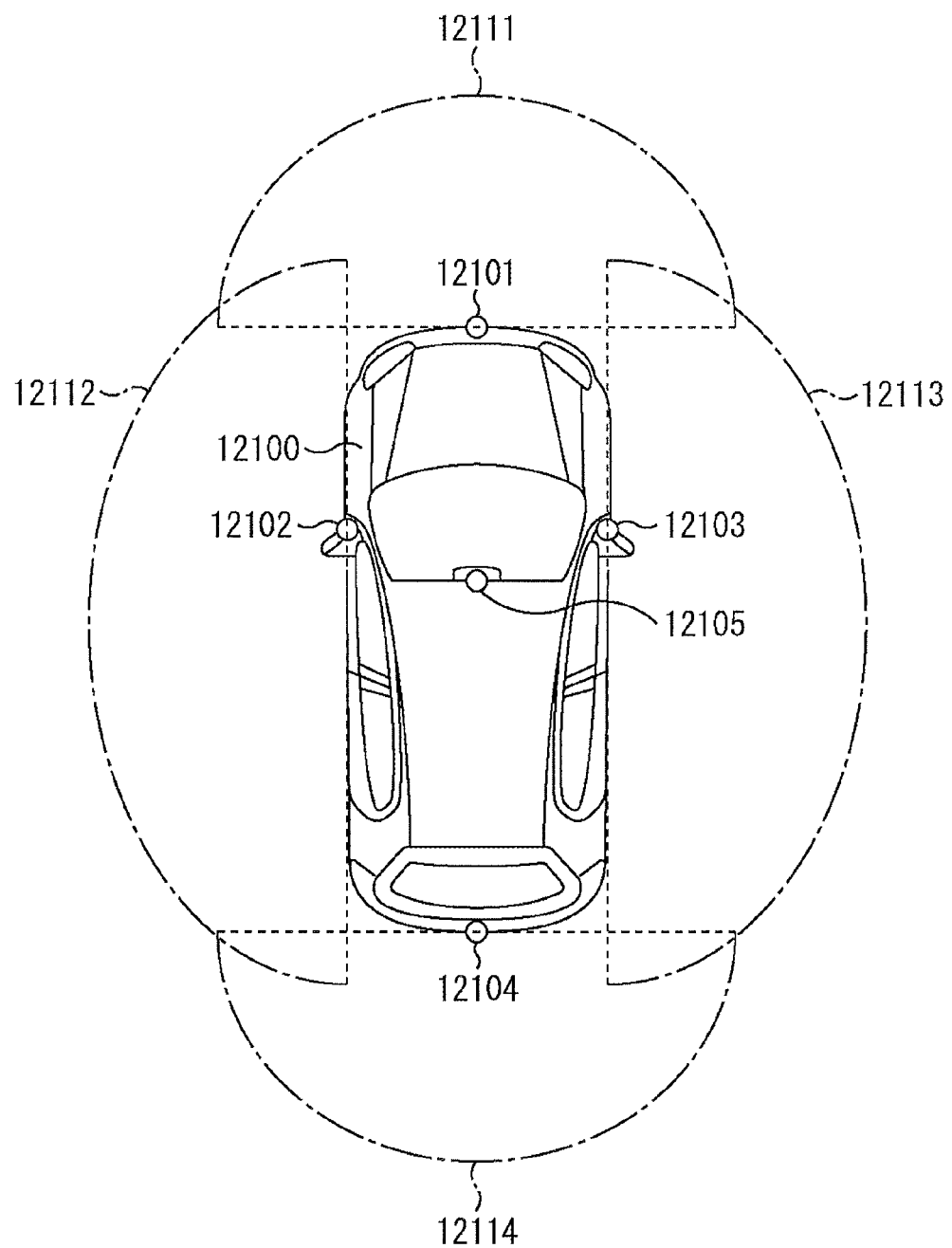
FIG. 27 is a diagram of assistance in explaining an example of installation positions of an outside-vehicle information detecting section and an imaging section.

FIG. 27 is a diagram depicting an example of the installation position of the imaging section 12031.

In FIG. 27, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the area ahead acquired by the imaging sections 12101 and 12105 are used chiefly to detect a preceding vehicle, a pedestrian, an obstacle, a traffic light, a traffic sign, a lane, or the like.

Incidentally, FIG. 27 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to an embodiment of the present disclosure may be applied to the imaging section 12031 among the components described above. Specifically, the image sensor PKG 1 described above is applicable as the imaging section 12031. Applying the technology according to the present disclosure to the imaging section 12031 makes it possible to increase the number of terminals while achieving miniaturization. This makes it possible to achieve, for example, a high-speed InterFace.

An embodiment of the present technology is not limited to the embodiments described above, but various changes and modifications may be made without departing from the scope of the technology.

For example, it is possible to adopt a combination of all or a portion of the plurality of embodiments described above.

Furthermore, the present technology is applicable not only to solid-state imaging units, but also to general semiconductor devices that have other semiconductor integrated circuits.

It is to be noted that the present technology may also be configured as below.

(1)

A solid-state imaging unit including:
an image sensor substrate including a light receiving region in which pixels that each convert incoming light to an electric signal are arranged in a matrix;
an external terminal that outputs the electric signal, the external terminal being disposed outside the image sensor substrate in a plane direction;
a glass substrate disposed to be opposed to the image sensor substrate and the external terminal; and
a through electrode that couples a wiring line and the external terminal to each other by penetrating an adhesive resin interposed between the wiring line and the external terminal, the wiring line being formed on the glass substrate.

(2)

The solid-state imaging unit according to (1), in which the adhesive resin is also formed to be interposed between the image sensor substrate and the glass substrate.

(3)

The solid-state imaging unit according to (1) or (2), in which
the external terminal is disposed outside a molding resin on a same plane as a plane of the image sensor substrate, and
the through electrode is also formed to penetrate the molding resin.

(4)

The solid-state imaging unit according to (3), in which the molding resin is also formed on a surface of the image sensor substrate, the surface being opposite to the glass substrate side.

(5)

The solid-state imaging unit according to (3), further including a first heat-dissipating plate on a surface of the molding resin, the surface being opposite to the glass substrate side.

(6)

The solid-state imaging unit according to (3), further including a first heat-dissipating plate between the molding resin and the adhesive resin.

(7)

The solid-state imaging unit according to (5) or (6), further including a second heat-dissipating plate on a surface of the image sensor substrate, the surface being opposite to the glass substrate side.

(8)

The solid-state imaging unit according to (5) or (6), in which the first heat-dissipating plate is formed to be coupled to at least one of a plurality of the through electrodes.

(9)

The solid-state imaging unit according to (6), in which the first heat-dissipating plate is formed to be coupled to at least one of a plurality of the external terminals.

(10)

The solid-state imaging unit according to any of (1) to (3), further including a metal film on a surface of the image sensor substrate, the surface being opposite to the glass substrate side.

(11)

The solid-state imaging unit according to any of (1) to (10), further including a dummy external terminal on a surface of the metal film.

(12)

The solid-state imaging unit according to (10), in which the metal film has a plurality of through holes.

(13)

The solid-state imaging unit according to any of (10) to (12), in which the metal film is formed to be coupled to at least one of a plurality of the external terminals.

(14)

The solid-state imaging unit according to any of (1) to (3), further including a companion chip on a surface of the image sensor substrate, the surface being opposite to the glass substrate side.

(15)

The solid-state imaging unit according to any of (1) to (14), including an electrode pad on a surface of the image sensor substrate, the surface being opposed to the glass substrate, in which the electrode pad is coupled to the wiring line formed on the glass substrate.

(16)

The solid-state imaging unit according to any of (1) to (15), in which the adhesive resin is transmissive to light.

(17)

The solid-state imaging unit according to any of (1) to (16), in which the adhesive resin has a refractive index similar to a refractive index of the glass substrate.

(18)

The solid-state imaging unit according to any of (1) to (17), in which the adhesive resin has a refractive index lower than a refractive index of an on-chip lens formed on the image sensor substrate.

(19)

A method of producing a solid-state imaging unit, the method including:
forming a wiring line on a glass substrate;
forming an adhesive resin on the glass substrate on which the wiring line is formed;
bonding a singulated image sensor substrate to the glass substrate to couple the singulated image sensor substrate to the wiring line;
forming a through electrode outside the image sensor substrate in a plane direction, the through electrode being coupled to the wiring line by penetrating the adhesive resin; and
forming an external terminal to couple the external terminal to the through electrode.

(20)

An electronic apparatus including
a solid-state imaging unit including
an image sensor substrate including a light receiving region in which pixels that each convert incoming light to an electric signal are arranged in a matrix,
an external terminal that outputs the electric signal, the external terminal being disposed outside the image sensor substrate in a plane direction,
a glass substrate disposed to be opposed to the image sensor substrate and the external terminal, and
a through electrode that couples a wiring line and the external terminal to each other by penetrating an adhesive resin interposed between the wiring line and the external terminal, the wiring line being formed on the glass substrate.

REFERENCE SIGNS LIST

1 Image sensor PKG, 11 Image sensor substrate, 12 Glass adhesive resin, 13 Glass substrate, 14 On-chip lens, 15 Electrode pad, 16 Pillar, 17 Wiring line pattern, 18 Molding resin, 19, 19d Through electrode, 20, 20d Solder ball, 21, 21d Rewiring line, 31 Through hole, 41 Companion chip, 61 Metal film, 62 Through hole, 71A, 71B Heat-dissipating plate, 300 Imaging apparatus, 302 Solid-state imaging unit

What is claimed is:

1. An image sensor package, comprising:
    a glass substrate, wherein the glass substrate has a first surface as a light incident surface, and a second surface opposite the first surface;
    a wiring line pattern formed on the second surface of the glass substrate;
    an image sensor substrate, wherein the image sensor substrate includes a light incident side that faces the second surface of the glass substrate, and wherein the image sensor substrate includes:
        a plurality of pixels arranged in a matrix in a light receiving region of the image sensor substrate;
        a plurality of on-chip lenses disposed on a light incident side and within the light receiving region of the image sensor substrate; and
        a plurality of electrode pads disposed on the light incident side and outside of the light receiving region of the image sensor substrate;
    a glass adhesive resin, wherein the glass adhesive resin couples the image sensor substrate to the glass substrate;
    a molding resin, wherein the molding resin seals the glass adhesive resin in an area outside of the image sensor substrate, and wherein the glass adhesive resin is between the molding resin and the glass substrate;
    a plurality of pillars, wherein each of the pillars in the plurality of pillars extends through the glass adhesive resin and electrically connects an electrode pad included in the plurality of electrode pads to the wiring line pattern; and
    a plurality of through electrodes, wherein each through electrode in the plurality of through electrodes extends from the wiring line pattern, through the glass adhesive resin and the molding resin.

2. The image sensor package of claim 1, further comprising:
    a plurality of external terminals, wherein each of the through electrodes in the plurality of through electrodes is electrically connected to an external terminal included in the plurality of external terminals.

3. The image sensor package of claim 2, wherein the external terminals are disposed on a surface of the molding resin opposite the glass adhesive resin.

4. The image sensor package of claim 3, wherein the surface of the molding resin opposite the glass adhesive resin is in a same plane as a side of the image sensor substrate that is opposite the light incident side of the image sensor substrate.

5. The image sensor package of claim 3, wherein the molding resin covers a side of the image sensor substrate that is opposite the light incident side of the image sensor substrate.

6. The image sensor package of claim 1, wherein an index of refraction of the glass adhesive resin is within +/−0.2 of the index of refraction of the glass substrate.

7. The image sensor package of claim 1, further comprising:
    a companion chip, wherein the companion chip is disposed on a side of the image sensor substrate that is opposite the light incident side of the image sensor substrate.

8. The image sensor package of claim 7, wherein a companion chip is disposed on a surface of the image sensor substrate.

9. The image sensor package of claim 1, wherein, along a plane parallel to the light incident surface of the glass substrate, the glass substrate has a larger size than the image sensor substrate.

10. The image sensor package of claim 9, wherein, in a view along a line perpendicular to the light incident surface of the glass substrate, the image sensor substrate is disposed substantially at a center of the image sensor package.

11. The image sensor package of claim 1, wherein the wiring line pattern extends towards an outer periphery of the image sensor package.

12. The image sensor package of claim 1, wherein the image sensor package is cavity-less.

13. The image sensor package of claim 1, further comprising:
    a metal film formed on a side of the image sensor substrate that is opposite the light incident side of the image sensor substrate.

14. The image sensor package of claim 13, wherein the metal film extends in a plan view taken along a line perpendicular to the light incident side of the image sensor substrate over an area that encompasses an entirety of the image sensor substrate.

15. The image sensor package of claim 14, further comprising:
    a plurality of solder balls disposed on a surface of the molding resin opposite the glass adhesive resin, wherein each of the solder balls in the plurality of solder balls is electrically connected to one of the through electrodes in the plurality of through electrodes, and wherein the metal film is joined to at least one of the solder balls included in the plurality of solder balls.

16. The image sensor package of claim 15, further comprising:
    a plurality of dummy solder balls formed on a surface of the metal film.

17. The image sensor package of claim 13, further comprising:
    an insulating film disposed between the metal film and a surface of the image sensor substrate.

18. The image sensor package of claim 1, further comprising:
    at least one heat-dissipating plate disposed on a surface of the molding resin.

19. The image sensor package of claim 18, wherein the at least one heat-dissipating plate is coupled to at least one through electrode included in the plurality of through electrodes.

20. An imaging apparatus, comprising:
    an optical section, wherein the optical section includes a plurality of lenses;
    an image sensor package, wherein light collected by the optical section is incident on the image sensor package, the image sensor package including:
        a glass substrate, wherein the glass substrate has a first surface as a light incident surface, and a second surface opposite the first surface;

a wiring line pattern formed on the second surface of the glass substrate;

an image sensor substrate, wherein the image sensor substrate includes a light incident side that faces the second surface of the glass substrate, and wherein the image sensor substrate includes:
- a plurality of pixels arranged in a matrix in a light receiving region of the image sensor substrate;
- a plurality of on-chip lenses disposed on a light incident side and within the light receiving region of the image sensor substrate; and
- a plurality of electrode pads disposed on the light incident side and outside of the light receiving region of the image sensor substrate;

a glass adhesive resin, wherein the glass adhesive resin couples the image sensor substrate to the glass substrate;

a molding resin, wherein the molding resin seals the glass adhesive resin in an area outside of the image sensor substrate, and wherein the glass adhesive resin is between the molding resin and the glass substrate;

a plurality of pillars, wherein each of the pillars in the plurality of pillars extends through the glass adhesive resin and electrically connects an electrode pad included in the plurality of electrode pads to the wiring line pattern; and a plurality of through electrodes, wherein each through electrode in the plurality of through electrodes extends from the wiring line pattern, through the glass adhesive resin and the molding resin; and a digital signal processor circuit, wherein the digital signal processor circuit processes an electric signal output by the image sensor package.

* * * * *